(12) United States Patent
Effros et al.

(10) Patent No.: US 10,951,292 B2
(45) Date of Patent: Mar. 16, 2021

(54) SYSTEMS AND METHODS FOR RANDOM ACCESS COMMUNICATION

(71) Applicant: California Institute of Technology, Pasadena, CA (US)

(72) Inventors: Michelle Effros, San Marino, CA (US); Victoria Kostina, Pasadena, CA (US); Recep C. Yavas, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 16/258,448

(22) Filed: Jan. 25, 2019

(65) Prior Publication Data

US 2019/0245604 A1 Aug. 8, 2019

Related U.S. Application Data

(60) Provisional application No. 62/797,089, filed on Jan. 25, 2019, provisional application No. 62/622,271, filed on Jan. 26, 2018.

(51) Int. Cl.
*H04B 7/06* (2006.01)
*H04W 74/08* (2009.01)
(Continued)

(52) U.S. Cl.
CPC ...... *H04B 7/0639* (2013.01); *H03M 13/3761* (2013.01); *H04B 7/063* (2013.01);
(Continued)

(58) Field of Classification Search
CPC . H04B 7/0639; H04B 7/063; H03M 13/3761; H04L 1/0057; H04L 5/1446; H04L 27/26; H04W 74/0833
See application file for complete search history.

(56) References Cited

U.S. PATENT DOCUMENTS 8,169,954 B2 5/2012 Usuda et al.
2006/0165190 A1 7/2006 Tamaki et al.
(Continued)

FOREIGN PATENT DOCUMENTS

| EP | 2447943 A2 * | 5/2016 | ............... H04L 1/00 |
|----|--------------|--------|--------------------------|
| WO | 2014025366 A1 | 2/2014 | |
| WO | 2019183601 A1 | 9/2019 | |

OTHER PUBLICATIONS

Wang et al. "Fountain Communication using Concatenated Codes", Feb. 2013, IEEE Transactions on communications, vol. 61, No. 2, pp. 443-454.*

(Continued)

*Primary Examiner* — Sophia Vlahos
(74) *Attorney, Agent, or Firm* — KPPB LLP

(57) ABSTRACT

Systems and methods for random access communication in accordance with various embodiments of the invention are described in which receivers can handle uncoordinated transmissions of a large and unknown number of transmitters. Communication systems in accordance with many embodiments of the invention include a plurality of transmitters that encode message data as symbols using a rateless code. During transmission, the transmitters receive feedback messages at a predetermined set of potential decoding times until an end of epoch message is received. A receiver transmits at least one start of epoch message and, at each of a predetermined set of decoding times, determines whether a decoding rule is satisfied. When the decoding rule is satisfied, the receiver can decode at least one message from observed symbols based upon the rateless code. The receiver can end the transmission epoch by transmitting an end of epoch message.

17 Claims, 6 Drawing Sheets

(51) Int. Cl.

| | |
|---|---|
| H04L 1/00 | (2006.01) |
| H03M 13/37 | (2006.01) |
| H04L 27/26 | (2006.01) |
| H04L 5/14 | (2006.01) |

(52) U.S. Cl.
CPC .......... H04L 1/0057 (2013.01); H04L 5/1446 (2013.01); H04L 27/26 (2013.01); H04W 74/0833 (2013.01)

(56) References Cited

U.S. PATENT DOCUMENTS

| | | | |
|---|---|---|---|
| 2007/0094580 A1 | 4/2007 | Livshitz | |
| 2007/0223620 A1* | 9/2007 | Kalhan | H04L 1/1867 375/295 |
| 2008/0043771 A1 | 2/2008 | Cho et al. | |
| 2008/0049685 A1 | 2/2008 | Becker et al. | |
| 2008/0247336 A1* | 10/2008 | Sugitani | H04B 7/2643 370/280 |
| 2009/0305690 A1 | 12/2009 | Yuda et al. | |
| 2011/0194478 A1 | 8/2011 | Lee et al. | |
| 2011/0216733 A1* | 9/2011 | Han | H04L 5/0007 370/329 |
| 2012/0117446 A1* | 5/2012 | Taghavi Nasrabadi | H04L 1/0003 714/776 |
| 2014/0369250 A1* | 12/2014 | Ren | H04L 1/0077 370/312 |
| 2015/0341146 A1 | 11/2015 | Chunlong et al. | |
| 2016/0212507 A1* | 7/2016 | Du | H04Q 9/00 |
| 2017/0054453 A1 | 2/2017 | Kim et al. | |
| 2017/0257195 A1* | 9/2017 | Maaref | H04L 1/189 |
| 2019/0021131 A1 | 1/2019 | Zhang et al. | |
| 2019/0297649 A1 | 9/2019 | Lahouti et al. | |

OTHER PUBLICATIONS

Shanechi et al. "Rateless Codes for MIMO Channels", 2008, IEEE. (Year: 2008).*
International Preliminary Report on Patentability for International Application PCT/US2019/023755, Report issued Sep. 22, 2020, dated Oct. 1, 2020, 7 Pgs.
Bentkus, "On the dependence of the Berry-Esseen bound on dimension," Journal of Statistical Planning and Inference, vol. 113, May 2003, pp. 385-402.
Dvoretzky et al., "Asymptotic minimax character of the sample distribution function and of the classical multinomial estimator", Annals of Mathematical Statistics, vol. 27, Sep. 1956, pp. 642-669.
Mathys, "A class of codes for a T active users out of N multiple-access communication system", IEEE Transactions on Information Theory, vol. 36, No. 6, Nov. 1990, pp. 1206-1219.
Minero et al., "Random Access: an Information-Theoretic Perspective", arXiv.org, Retrieved from: https://arxiv.org/pdf/0912.3264.pdf, Dec. 16, 2009.
Roberts, "ALOHA packet system with and without slots and capture", ACM SIGCOMM Computer Communication Review, vol. 5, No. 2, Apr. 1975, pp. 28-42.
Smirnov, "Approximate laws of distribution of random variables from empirical data", Usp. Mat. Nauk., vol. 10, 1944, pp. 179-206.
Tschamkerten et al., "Variable length coding over an unknown channel", IEEE Transactions on Information Theory, vol. 52, May 2006, pp. 2126-2145.
International Search Report and Written Opinion for International Application No. PCT/US2019/023755, Search completed Jul. 10, 2019, dated Jul. 10, 2019, 10 pgs.
Ahlswede, "An elementary proof of the strong converse theorem for the multiple-access channel", Journal Combinatorics, Information and System Sciences, vol. 7, No. 3, 1982, pp. 1-16.
Bassalygo et al., "Restricted Asynchronous Multiple Access", Problemy Peredachi Informatsii, vol. 19, No. 4, 1983, pp. 92-96.

Berger, "The Poisson multiple-access conflict resolution problem", Multi-user communication systems, 1981, pp. 1-27.
Blackwell et al., "The Capacity of a Class of Channels", The Annals of Mathematical Statistics, vol. 30, No. 4, Dec. 1959, pp. 1229-1241.
Blits et al., "Universal rateless coding with finite message set", Proceedings of the IEEE International Symposium on Information Theory, Cambridge, Massachusetts, Jul. 1-6, 2012, pp. 1772-1776.
Burnashev, "Data Transmission over a Discrete Channel with Feedback. Random Transmission Time", Problems of Information Transmission, vol. 12, No. 4, 1976, pp. 250-265.
Casini et al., "Contention resolution diversity slotted Aloha (CRDSA): An enhances random access scheme for satellite access packet networks", IEEE Transaction on Wireless Communications, vol. 6, No. 4, 2007, pp. 1408-1419.
Chen et al., "Capacity of Gaussian Many-Access Channels", IEEE Transactions on Information Theory, vol. 63, No. 6, Jun. 2017, pp. 3516-3539.
Chen et al., "Many-Access Channels: The Gaussian Case with Random User Activities", arXiv:1405.0893v1 [cs.IT], May 5, 2014, 5 pgs.
Csiszar et al., "Information theory and statistics: A tutorial", Commun. Inf. Theory, vol. 1, Dec. 2004, pp. 417-528.
D'Yachkov et al., "A coding model for a multiple-access adder channel", Problems of Information Transmission, vol. 17, No. 2, Apr. 1981, pp. 26-38.
Draper et al., "Efficient variable length channel coding for unknown DMCs", Proceedings of the International Symposium on Information Theory, Chicago, Illinois, Jun. 27-Jul. 2, 2004, p. 379.
Dueck, "Maximal error capacity regions are smaller than average error capacity regions for multi-user channels", Problems of Control and Information Theory, 1978, vol. 7, No. 1, pp. 11-19.
Dueck, "The Strong Converse of the Coding Theorem for the Multiple-access Channel", Journal of Combinatorics, Information, and System Sciences, 1981, vol. 6, pp. 187-196.
Ebrahimi et al., "Coded random access design for constrained outage", Proceedings of the IEEE International Symposium on Information Theory (ISIT), Aachen, Germany, Jun. 25-30, 2017, pp. 2732-2736.
Effros et al., "Random Access Channel Coding in the Finite Blocklength Regime", arXiv.org, Retrieved from: https://arxiv.org/pdf/1801.09018.pdf, Jul. 26, 2019, 9 pgs.
Fong et al., "A proof of the strong converse theorem for gaussian multiple access channels", IEEE Transactions on Information Theory, vol. 62, Aug. 2016, pp. 4376-4394, arXiv:1509.01380.
Gibbs et al., "On choosing and bounding probability metrics", International Statistical Review, 2002, vol. 70, No. 3, pp. 419-435.
Gudipati et al., "AutoMAC: Rateless Wireless Concurrent Medium Access", MobiCom 2012, Istanbul, Turkey, Aug. 22-26, 2012.
Hoeffding, "Asymptotically optimal tests for multinomial distributions", Annals of Mathematical Statistics, vol. 36, Apr. 1965, pp. 369-401.
Huang et al., "Finite Blocklength Coding for Multiple Access Channels", Proceedings of the IEEE International Symposium on Information Theory Proceedings, Cambridge, Massachusetts, Jul. 1-6, 2012, 5 pgs.
Huang et al., "Strong large deviations for composite hypothesis testing", 2014 IEEE International Symposium on Information Theory, Jun. 2014, pp. 556-560.
Kolmogorov, "Sulla Determinazione Empirica di una Legge di Distribuzione", Giornale dell'Istituto Italiano degli Attuari, vol. 4, 1933, pp. 83-91.
Liva, "Graph-based analysis and optimization of contention resolution diversity slotted Aloha", IEEE Transactions on Communications, vol. 59, No. 2, Feb. 2011, pp. 477-487.
Luby, "LT Codes", Proceedings of the 43rd Annual IEEE Symposium on Foundations of Computer Science, Vancouver, BC, Canada, Nov. 19, 2002, 10 pgs.
Massart, "The tight constant in the Dvoretzky-Kiefer-Wolfowitz inequality", Annals of Probability, vol. 18, Jul. 1990, pp. 1269-1283.

(56) References Cited

OTHER PUBLICATIONS

Minero et al., "Random Access: An Information-Theoretic Perspective", IEEE Transactions on Information Theory, vol. 58, No. 2, Feb. 6, 2012, pp. 909-930.

Molavianjazi et al., "Simpler achievable rate regions for multiaccess with finite blocklength", Proceedings 2012 IEEE International Symposium on Information Theory, Jul. 2012, pp. 36-40.

Molavianjazi et al., "A Second-Order Achievable Rate Region for Gaussian Multi-Access Channels via a Central Limit Theorem for Functions", IEEE Transactions on Information Theory, vol. 61, No. 12, Dec. 2015, pp. 6719-6733.

Moulin, "A new metaconverse and outer region for finite-blocklength MACs", Proceedings 2013 Information Theory and Applications Workshop, San Diego, CA, Feb. 2013, pp. 1-8.

Nikopour et al., "Sparse code multiple access", IEEE 24th Annual International Symposium on Personal, Indoor, and Mobile Radio Communications, 2013, pp. 332-336.

Ordentlich et al., "Low Complexity Schemes for the Random Access Gaussian Channel", Proceedings of the IEEE International Symposium on Information Theory (ISIT), Aachen, Germany, Jun. 25-30, 2017, 10 pgs.

Paolini et al., "High throughput random access via codes on graphs: coded slotted Aloha", arXiv.org, Retrieved from: https://arxiv.org/pdf/1102.2516.pdf, Feb. 12, 2011, 6 pgs.

Polyanskiy, "A perspective on massive random-access", Proceedings of the IEEE International Symposium on Information Theory (ISIT), Aachen, Germany, Jun. 25-30, 2017, 5 pgs.

Polyanskiy, "On dispersion of compound DMCs", Proceedings of the 51st Annual Allerton Conference on Communication, Control, and Computing, Monticello, Illinois, Oct. 2-4, 2013, 8 pgs.

Polyanskiy et al., "Channel Coding Rate in the Finite Blocklength Regime", IEEE Transactions on Information Theory, vol. 56, No. 5, May 2010, pp. 2307-2359.

Polyanskiy et al., "Feedback in the Non-Asymptotic Regime", IEEE Transactions on Information Theory, vol. 57, No. 8, Aug. 2011, pp. 4903-4925.

Polyanskiy et al., "Lecture Notes on Information Theory", MIT (6.441), UIUC (ECE 563), Yale (STAT 664), 2012-2017, 342 pgs.

Popovski et al., "Random access protocols based on rateless codes", 2013, 7 pgs.

Richardson et al., "Design of capacity-approaching irregular low-density parity-check codes", IEEE Transaction on Information Theory, vol. 47, No. 2, 2001, pp. 619-637.

Sarwate et al., "Some observations on limited feedback for multi-access channels", IEEE International Symposium on Information Theory, Aug. 2009, pp. 394-397.

Scarlett et al., "Second-Order Rate Region of Constant-Composition Codes for the Multiple-Access Channel", IEEE Transactions on Information Theory, vol. 61, No. 1, Jan. 2015, pp. 157-172.

Shepp et al., "Entropy of the sum of independent bernoulli random variables and of the multinomial distribution", Contributions to Probability, Academic Press, 1981, pp. 201-206.

Shirvanimoghaddam et al., "Probabilistic rateless multiple access for machine-to-machine communication", IEEE Transaction on Wireless Communications, vol. 14, No. 12, 2015, pp. 6815-6826.

Shulman, "Communication over an unknown channel via common broadcasting", PhD thesis, Tel Aviv University, 2003, 145 pgs.

Stefanovic et al., "Aloha Random Access that Operates as a Rateless Code", arxiv.org, Retrieved from: https://arxiv.org/pdf/1308.1503.pdf, Aug. 7, 2013, 10 pgs.

Storn et al., "Differential evolution—a simple and efficient heuristic for global optimization over continuous spaces", Global Optimization, vol. 11, No. 4, 1997, pp. 341-359.

Tan et al., "On the Dispersions of Three Network Information Theory Problems", IEEE Transactions on Information Theory, vol. 60, No. 2, Feb. 2014, pp. 881-903, arXiv:1201.3901.

Tchamkerten et al., "A Feedback Strategy for Binary Symmetric Channels", Proceedings of the IEEE International Symposium on Information Theory, Lausanne, Switzerland, Jun. 30-Jul. 5, 2002, pp. 362.

Truong et al., "On the Gaussian MAC with stop-feedback", Proceedings of the IEEE International Symposium on Information Theory (ISIT), Aachen, Germany, Jun. 25-30, 2017, pp. 2303-2307.

Zeitouni et al., "On universal hypotheses testing via large deviations", IEEE Transactions on Information Theory, vol. 37, No. 2, Mar. 1991, pp. 285-290.

* cited by examiner

SYSTEMS AND METHODS FOR RANDOM ACCESS COMMUNICATION

CROSS-REFERENCE TO RELATED APPLICATIONS

The present invention claims priority to U.S. Provisional Patent Application Ser. No. 62/622,271 entitled "Method for Random Access Communication" to Michelle Effros et al., filed Jan. 26, 2018 and U.S. Provisional Patent Application Ser. No. 62/797,089 entitled "Random Access Channel Coding in the Finite Blocklength Regime" to Michelle Effros et al., filed Jan. 25, 2019. The disclosures of U.S. Provisional Patent Application Ser. Nos. 62/622,271 and 62/797,089 are herein incorporated by reference in their entirety.

STATEMENT OF FEDERALLY SPONSORED RESEARCH

This invention was made with government support under Grant Nos. CCF1527524, CCF1566567 & CCF1817241 awarded by the National Science Foundation. The government has certain rights in the invention.

FIELD OF THE INVENTION

The present invention generally relates to communication systems and more specifically to communication systems that enable simultaneous transmission by multiple transmitters on a random access channel.

BACKGROUND

Random access is a common medium access control scheme utilized when multiple transmitters share a common channel. In a random access channel, sometimes called a multiple access channel, the channel is shared by multiple transmitters (i.e. a multiple-transmitter channel). Random access channels are multiple-transmitter channels characterized in that messages are not scheduled in advance. Each transmitter that has access to a random access channel can attempt to transmit at any time (or time slot), which can cause collisions that typically result in the transmitters being denied access to the channel and/or information loss.

Wireless access points including (but not limited to) WiFi hot spots and cellular base stations often utilize random access channels to setup communications via channels requiring scheduled access. In heavily utilized networks, random access channels utilized to schedule network resources are often the network's most critical bottleneck.

Multiple-transmitter channels are understood in information theory when the number and identities of transmitters are fixed and known. Even in this known-transmitter regime, information-theoretic solutions are often too complex to implement. As a result, orthogonalization methods, such as TDMA, FDMA, and orthogonal CDMA, are often used instead. Orthogonalization strategies simplify coding by scheduling the transmitters, but such methods can at best attain sum-rate equal to the single-transmitter capacity of the channel, which is significantly smaller than the maximal multi-transmitter sum-rate.

Most random access protocols currently in use rely on collision avoidance, which typically cannot surpass the single-transmitter capacity of the channel and may be significantly worse since an unknown transmitter set can make it difficult to schedule or coordinate among transmitters. Collision avoidance can be achieved through variations of the legacy (slotted) ALOHA and carrier sense multiple access (CSMA) algorithms. ALOHA, which uses random transmission times and back-off schedules, achieves only about 37% of the single-transmitter capacity of the channel. In CSMA, each transmitter tries to avoid collisions by verifying the absence of other traffic before starting a transmission over the shared channel. When collisions do occur, for example because two transmitters begin transmission at the same time, all transmissions are aborted, and a jamming signal is sent to be sure that all transmitters are aware of the collision. The procedure starts again at a random time, which again introduces inefficiencies.

The state of the art in random access coding is "treating interference as noise," which is part of newer CDMA-based standards. While this strategy can deal with random access better than ALOHA, it is still far inferior to the theoretical limits. Two-layer MAC decoders, with outer layer codes that work to remove channel noise and inner layer codes that work to resolve conflicts have been proposed. However, these systems rely on codes designed for a predetermined number of transmitters, k; it is not clear how robust they are to randomness in the transmitters' arrivals and departures.

SUMMARY OF THE INVENTION

Systems and methods in accordance with various embodiments of the invention enable a receiver to simultaneously receive messages transmitted over a random access channel by an unknown number of transmitters. In many embodiments, reliable decoding is possible in this regime, but, it is possible to attain both the capacity and the dispersion of the multiple access channel (MAC) in operation. In a number of embodiments, the communication systems do as well in first- and second-order performance as if the transmitter activity were known everywhere a priori.

Since the capacity region of a MAC varies with the number of transmitters, it is tempting to believe that the transmitters of a random access system must somehow vary their codebook size in order to match their transmission rate to the capacity region of the MAC in operation. Instead, communication systems in accordance with various embodiments of the invention employ rateless codes, which are codes that can accommodate variable decoding times. Due to the use of rateless codes, decoders in accordance with a number of embodiments of the invention can effectively control the rate at which each transmitter transmits by varying decoding time depending on the observed channel output. In this way, the rate at which each transmitter communicates is determined at the receiver by changing not the size but the blocklength of each transmitter's codebook.

While many rateless codes allow truly arbitrary decoding times, systems and methods in accordance with a number of embodiments of the invention only allow decoding at a predetermined list of possible times $n_0, n_1, n_2, \ldots$ . This strategy can both ease practical implementation and reduce feedback. In a number of embodiments, the decoder transmits a single-bit acknowledgment message to the encoder(s) at the end of every potential decoding time period that indicates whether or not the decoder is ready to decode the transmitted message at that time. If the decoder is not yet ready to decode the message, then the transmitters continue to transmit the message using the rateless code. When the decoder is ready to decode, receipt of the appropriate message indicating this fact by the transmitters indicates that active transmitters can commence transmitting a new message using the rateless code. If the decoding time is random, this so-called "single-bit" feedback forces the transmitter(s) to listen to the channel constantly, at every time step trying to discern whether or not a transmission was received. This either requires full-duplex devices or doubles the effective blocklength and can be quite expensive. Thus while the receiver technically sends only "one bit" of feedback, the transmitters receive one bit of feedback (with the alphabet {"transmission", "no transmission"}) in every time step, giving a feedback rate of 1 bit per channel use rather than a total of 1 bit. Accordingly, communication systems in accordance with many embodiments of the invention only send acknowledgment bits at times $n_0, n_1, n_2, \ldots, n_t$, and thus the transmitters need only listen at a finite collection of time steps, giving a total number of feedback bits equal to one plus (the receiver's estimate of) the number of transmitters, a feedback rate that can approach 0 bits per channel use as the blocklength grows.

A communication system in accordance with one embodiment of the invention includes a plurality of transmitters that each comprise an encoder, wherein the encoder of a given transmitter is configured to: receive a start of epoch message; select a codebook; encode message data as symbols using a rateless code determined using the selected codebook; and receive feedback messages at a predetermined set of potential decoding times. In addition, the transmitter is configured to transmit symbols until a received feedback message is an end of epoch message. The communication system also includes a receiver comprising a decoder, where the decoder is configured to: select at least one codebook; cause a broadcast transmitter to transmit at least one start of epoch message; receive observed symbols; and at each of a predetermined set of decode times, determine whether a decoding rule is satisfied. When the decoding rule is satisfied, the decoder is configured to decode at least one message based upon the received observed symbols based upon the rateless code and the selected at least one codebook and cause the broadcast transmitter to transmit an end of epoch message.

In a further embodiment, the determination of whether a decoding rule is satisfied is based upon the received observed symbols.

In another embodiment, the transmitter is configured to select a codebook based upon the start of epoch message.

In a still further embodiment, the broadcast transmitter transmits the at least one start of epoch message based upon the selected at least one codebook.

In still another embodiment, the broadcast transmitter is further configured to transmit at least one additional message based upon the selected at least one codebook.

In a yet further embodiment, multiple transmitters in the plurality of transmitters are configured to select the same codebook to use in the encoding of message data as symbols using a rateless code.

In yet another embodiment, at least two of the plurality of transmitters are configured to select different codebooks to use in the encoding of message data as symbols using a rateless code.

In a further embodiment again, the receiver applies decoding rules at separate predetermined times with respect to each of the different codebooks.

In another embodiment again, the broadcast transmitter sends a negative acknowledgement feedback message when the decoding rule is not satisfied at a predetermined decode time.

In a further additional embodiment, the encoder is configured to continue to encode message data as symbols using a rateless code determined using the selected codebook in response to receipt of a negative acknowledgement feedback message.

A transmitter system in accordance with one embodiment of the invention includes: a receiver configured to receive a start of epoch message; an encoder; and a modulator configured to transmit symbols encoded by the encoder. In addition, the encoder is configured to: select a codebook; and encode message data as symbols using a rateless code determined using the selected codebook. Furthermore, the receiver is further configured to receive an end of epoch message at one of a predetermined set of times, and the modulator is configured to transmit symbols encoded by the encoder until an end of epoch message is received by the receiver.

In a further embodiment, the transmitter is configured to select a codebook based upon the start of epoch message.

In another embodiment, the encoder is configured to continue to encode message data as symbols using a rateless code determined using the selected codebook in response to receipt of a negative acknowledgement feedback message.

A receiver system in accordance with one embodiment of the invention includes: a decoder configured to select at least one codebook; a transmitter configured to transmit at least one start of epoch message; and a receiver configured to receive observed symbols. In addition, the decoder is further configured to: determine whether a decoding rule is satisfied at each of a predetermined set of decode times; and when the decoding rule is satisfied, decode at least one message based upon the received observed symbols based upon a rateless code determined using the selected at least one codebook and cause the transmitter to transmit an end of epoch message.

In a further embodiment, the determination of whether a decoding rule is satisfied is based upon the received observed symbols.

In another embodiment, the transmitter transmits the at least one start of epoch message based upon the selected at least one codebook.

In a still further embodiment, the transmitter is further configured to transmit at least one additional message based upon the selected at least one codebook.

In still another embodiment, the decoder is configured to select a single codebook and determines whether the decoding rule is satisfied assuming that all transmitters are using the single codebook.

In a yet further embodiment, the decoder is configured to select a plurality of different codebooks and and applies decoding rules at separate predetermined times with respect to each of the different codebooks.

In yet another embodiment, the broadcast transmitter sends a negative acknowledgement feedback message when the decoding rule is not satisfied at a predetermined decode time.

Figure 1:
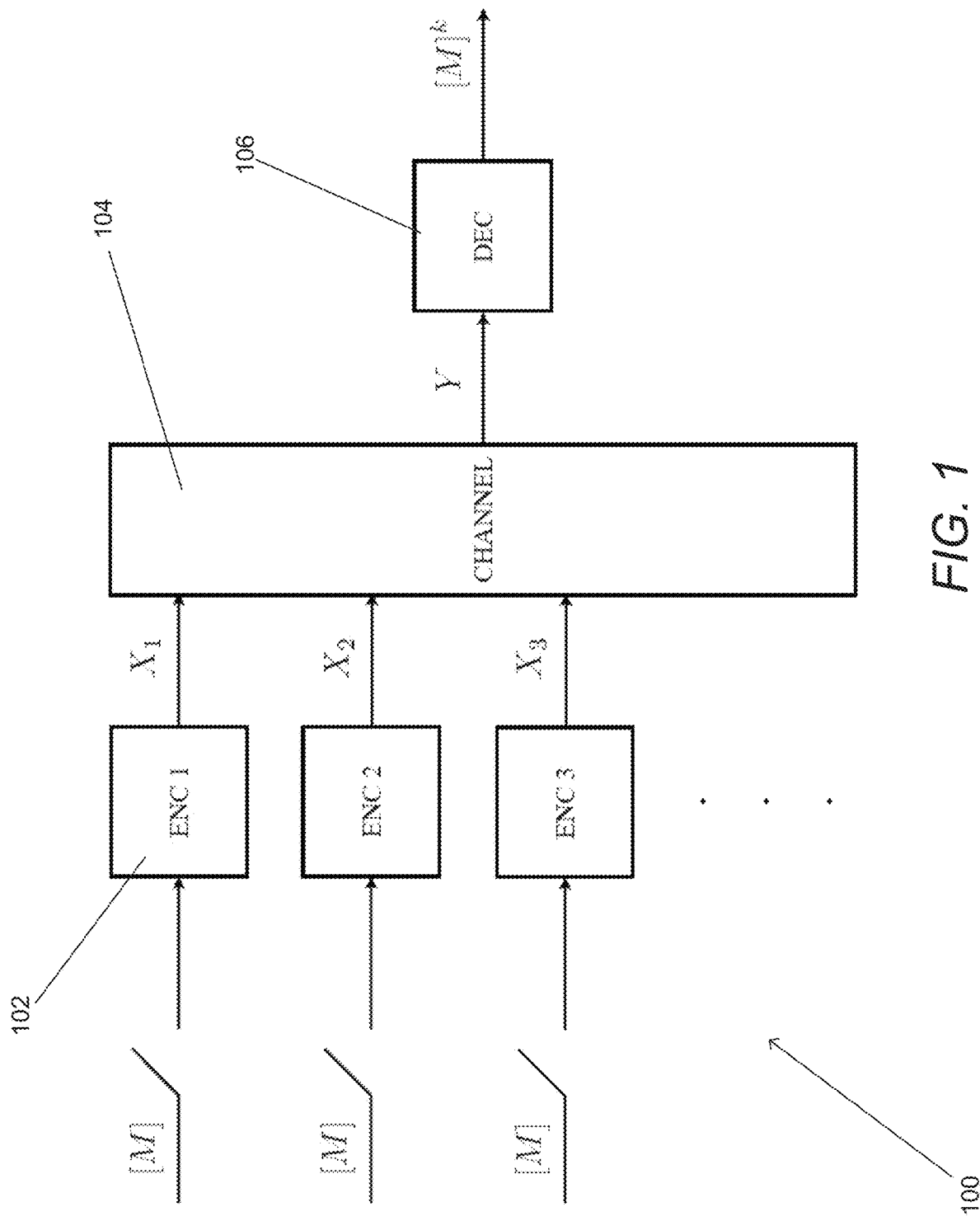
FIG. 1 conceptually illustrates a receiver configured to control the transmission of transmitters during epochs defined by the receiver in accordance with an embodiment of the invention.

of a system in accordance with an embodiment of the invention for the adder-erasure RAC with erasure probability $\delta=0.2$ for the target error probability $\epsilon_k=10^{-6}$ for all k. For each curve, the message size M is fixed such that the rates $\{R_k\}$ are achievable with $n_1$ equal to 20, 100, 500, and 2500, respectively.

DETAILED DESCRIPTION

Turning now to the drawings, systems and methods for random access communication in accordance with various embodiments of the invention are illustrated. In many embodiments, receivers can handle uncoordinated transmissions of a large and unknown number of transmitters. Systems and methods in accordance with many embodiments of the invention utilize an agnostic random access model, in which each transmitter knows nothing about the set of active transmitters beyond what it learns from limited feedback from the receiver, and the receiver knows nothing about the set of active transmitters beyond what it learns from the channel output. In several embodiments, a rateless coding strategy is utilized within the communication system in which the decoder attempts to decode only at a finite set of decoding times. At each decoding time within the set of decoding times, in some embodiments, the receiver broadcasts the acknowledgment to all transmitters indicating whether or not the transmitters can cease transmitting the messages that they have been transmitting using rateless codes. It can be proven that for a nontrivial class of channels, when k transmitters are active, communication systems that employ codes similar to those described herein perform as well in terms of capacity and dispersion as the best known code for the k-transmitter MAC in which the transmitter activity is known a priori.

In a number of embodiments, a random access channel (RAC) communication strategy is utilized in which communication occurs in epochs, with each epoch beginning in the time step following the previous epoch's end. In several embodiments, each epoch ends with a positive acknowledgment bit (ACK), which the receiver broadcasts to all transmitters as described below. At the beginning of each epoch, each transmitter independently decides whether to be active or silent in that epoch. In some embodiments, the decision is binding for the length of the epoch, meaning that a transmitter must either actively transmit for all time steps in the epoch or remain silent for the same period. Thus, in these embodiments, while the total number of transmitters is potentially unlimited, the number of active transmitters stays constant during the entire transmission period between two positive ACKs.

In a number of embodiments, the single-bit feedback strategy described above is employed within a communication system that utilizes rateless coding to deal with the agnostic nature of random access. Specifically, the code design fixes a number of different blocklengths of increasing size that each correspond to an increasingly large number of transmitters. When the receiver has a reliable estimate of the number of active transmitters, the receiver sends a positive ACK when the decoder determines that a decoding rule is satisfied. In addition to sending the positive ACK, many embodiments of the invention also transmit a string that indicates a codebook to be utilized by active transmitters during the next epoch. As is discussed further below, the string provides a common randomness between the transmitters and the receiver indicating the codebook for the rateless code that should be utilized in the next epoch. In many embodiments, the decoding rule indicates whether the messages transmitted by the active transmitters can be decoded with high probability. Naturally, the greater the number of active transmitters, the longer it takes to decode. In many embodiments, a single codebook is utilized during each epoch by all transmitters, which can be referred to as identical encoding. Some embodiments that employ identical encoding utilize a single threshold as a decoding rule at the decoder instead of $2^k-1$ simultaneous threshold rules. Other embodiments that employ non-identical encoding also utilize a single threshold rule. The use of decoding rules is discussed further below.

The main idea behind rateless coding is to have a continuous transmission that can be used to recover the original message. When the receiver decodes the message, it provides feedback to stop further transmission. The name "rateless" is due to the fact that the data rate of the transmission is only defined when the receiver decodes the message and sends feedback. Rateless codes were originally analyzed in Burnashev, M. V., 1976, Data transmission over a discrete channel with feedback, Random transmission time, Problemy peredachi informatsii, 12(4), pp. 10-30, which computed the error exponent of variable-length coding over a known point-to-point channel. A dispersion-style analysis of the same scenario is provided in Polyanskiy, Y., Poor, H. V. and Verdú, S., 2011, Feedback in the non-asymptotic regime, IEEE Transactions on Information Theory, 57(8), pp. 4903-4925. A practical implementation of rateless codes for an erasure channel with an unknown erasure probability appeared in Luby, M., 2002, November, LT codes, In Proceedings 43rd Annual IEEE Symposium on Foundations of Computer Science (p. 271-280), IEEE. An analysis of rateless coding over an unknown binary symmetric channel appeared in Tchamkerten, A. and Telatar, E., 2002, A feedback strategy for binary symmetric channels, In Information Theory, 2002, Proceedings, 2002 IEEE international Symposium on (p. 362). IEEE, and is extended to an arbitrary discrete memoryless channel in Draper, S. C. Frey, B. J. and Kschischang, F. R., 2004, Efficient variable length channel coding for unknown DMCs, In Information Theory, 2004, ISIT 2004, Proceedings, International Symposium on (pp. 379-379), IEEE; and Shulman, N. and Feder, M., 2003, Communication over an unknown channel via common broadcasting (Doctoral dissertation, Tel Aviv University). The approaches of Draper et al. and Schulman et al. both used a decoder that tracks Goppa's empirical mutual information and decodes once that quantity passes a threshold. In Blits, N. and Feder, M., 2012, July, Universal rateless coding with finite message set, In Information Theory Proceedings (ISIT), 2012 IEEE International Symposium on (pp. 1772-1776), IEEE, Jeffrey's prior is used to weigh unknown channels. The relevant disclosure including disclosure related to encoding and decoding of message data using rateless codes from the above papers is incorporated by reference herein in its entirety.

In several embodiments, the communication system assumes a random access communication model that is built from a family of permutation-invariant MACs and the receiver employs identity-blind decoding. Although not critical for the feasibility of a communication system in accordance with various embodiments of the invention, these assumptions can lead to a number of pleasing simplifications of both system implementation and analysis. For example, the collection of MACs comprising the compound random access channel model can be parameterized by the number of active transmitters rather than by the full transmitter activity pattern. If the maximum number of transmitters is finite, the analysis of identity-blind decoding differs little from traditional analyses that use independent realizations of a random codebook at each transmitter. Rather than requiring a unique encoder for every transmitter, in many embodiments all transmitters can use the same encoder. Systems in which all transmitters use the same encoder can be said to employ identical encoding, which enables a single encoder design to be used no matter how many transmitters are active.

In order to evaluate the benefits of using a random access communication scheme in accordance with certain embodiments of the invention, a second-order analysis is presented below of the rate that can be universally achieved by multiuser schemes over all transmitter activity patterns, taking into account the possibility that the decoder may misdetect the current activity pattern and decode for the wrong channel. Leveraging the observation that for a symmetric MAC, the fair rate point is not a corner point of the capacity region, it is possible to show that the single-threshold decoding rule referenced above attains the fair rate point.

Systems and methods for random access communication in accordance with various embodiments of the invention are discussed further below.

Random Access Channel Model

Communication systems in accordance with various embodiments of the invention impose restrictions on active transmitters. Specifically, the receiver uses positive acknowledgment messages to define epochs. During each epoch, transmitters must decide whether or not they wish to be active. An active transmitter transmits symbols for the duration of the epoch, where each symbol is generated based upon a set of message data bits using a rateless code. A receiver configured to control the transmission of transmitters during epochs defined by the receiver in accordance with an embodiment of the invention is conceptually illustrated in FIG. 1.

The communication system 100 includes a number of transmitters that each includes an encoder 102. Each transmitter that has message data to transmit can choose to become active during any given epoch. When a transmitter is active, the transmitter can provide a sequence of message bits to a rateless encoder 102, which generates a sequence of output symbols that are transmitted over a channel 104. When multiple transmitters are active, the active transmitters simultaneously transmit over the RAC channel 104 to a receiver. As discussed above, the use of rateless codes enables the receiver to continue to receive symbols (i.e., extend the duration of a particular epoch) until the receiver's decoder 106 has observed enough symbols to decode the transmitted messages with high probability. In many embodiments, the decoder employs a decoding rule that is applied at a predetermined set of potential decoding times. In several embodiments, each potential decoding time in the set of potential decoding times corresponds to a number of symbols determined to be required for the decoder to be able to decode messages from a specific number of transmitters. In certain embodiments, application of the decoding rule essentially involves attempting to decode a number of messages at each potential decoding time, which indirectly provides an estimate of the number of transmitters that are active during an epoch. Based upon the decoding rule, the decoder tries decoding at each subsequent decoding time in the set of potential decoding times. It chooses the first decoding time from that set for which it finds a collection of messages consistent with its received symbols and with the activity set or sets corresponding to that decoding time.

As noted above, the receiver need not continuously transmit its decoding state to the transmitters. In a number of embodiments, the transmitters and the receiver establish a set of potential decoding times and the receiver sends a positive or negative ACK at each potential decoding time indicating whether the receiver requires more symbols to be able to decode the messages with a high probability (i.e. a negative ACK) or whether the receiver has received enough symbols and has decided to decode the messages and start a new epoch (i.e. a positive ACK).

In many embodiments, the set of potential decoding times is determined based upon channel conditions. As the channel deteriorates, the receiver can adapt and choose a set of potential decoding times where the number of symbols required to be received during an epoch for a given estimated number of transmitters increases. When the channel improves the receiver can adapt to a set of potential decoding times in which the number of symbols required to be received for a given estimated number of transmitters decreases. In a number of embodiments, the receiver adapts the set of potential decoding times utilized during a particular epoch based upon a measurement of channel conditions including (but not limited to) channel noise. In several embodiments, the receiver periodically signals a guard interval in which transmitters are required to cease activity. During this guard interval, the receiver can measure channel noise and determine an appropriate set of potential decoding times. The receiver can then broadcast the set of potential decoding times and/or an identifier of the set of potential decoding times to the transmitters and can initiate the next epoch via a positive ACK. The transmitters can then monitor the feedback channel for positive and negative ACKs based upon the set of potential decoding times communicated by the receiver. Although specific methods are described for adapting between different sets of potential decoding times, it can readily be appreciated that any of a variety of techniques can be utilized for determining an appropriate set of decode times for a given set of channel conditions and coordinating the adoption of such a set of decode times by the receiver and transmitters in accordance with various embodiments of the invention.

In a number of embodiments, all transmitters use the same encoder 102 and the receiver broadcasts an indication of a particular codebook to use in a given epoch. In several embodiments, the transmitters are able to use different codebooks. Using different codebooks can enable the decoder to identify the transmitter that transmitted a specific message decoded by the decoder 106. Using different codebooks can also enable the encoders to transmit different numbers of messages and attain different rates. When transmitters encode using different encoders, the receiver can transmit information indicating the specific codebook to be used by a particular encoder at the start of a particular epoch. The receiver can then utilize knowledge of the different codebooks in the decoding of the transmitted messages from the observed symbols.

Although specific communication systems are described above with reference to FIG. 1, any of a variety of transmitters and receivers that employ rateless codes to transmit data over a RAC channel can be utilized as appropriate to the requirements of a given application in accordance with various embodiments of the invention. Indeed, communication systems in accordance with various embodiments of the invention are in no way limited to any particular communication medium, spectral band, and/or modulation or demodulation scheme. Symbols encoded in accordance with various embodiments of the invention can be transmitted using any number of different modulation schemes appropriate to the requirements of a given application and/or can employ additional outer codes to correct bit errors in the messages decoded by the receiver. The transmitters and receivers described herein should be understood as being capable of being deployed in any communication system in which an unknown number of transmitters utilize a shared channel to communicate with a receiver. A number of specific encoding and decoding processes in accordance with different embodiments of the invention are discussed below.

Processes for Encoding Data for Transmission Via a RAC

Transmitters in accordance with various embodiments of the invention are configured to wait to transmit data until the start of an epoch and then transmit data throughout the epoch while listening periodically for a positive acknowledgment message that indicates the end of the epoch. As discussed above, the codebook selected for the rateless code is coordinated with the receiver. Therefore, the transmitter must also monitor a feedback channel for a transmission from a receiver containing a codebook and/or an identifier for a codebook to be utilized within a specified (e.g. the next) epoch.

Figure 2:
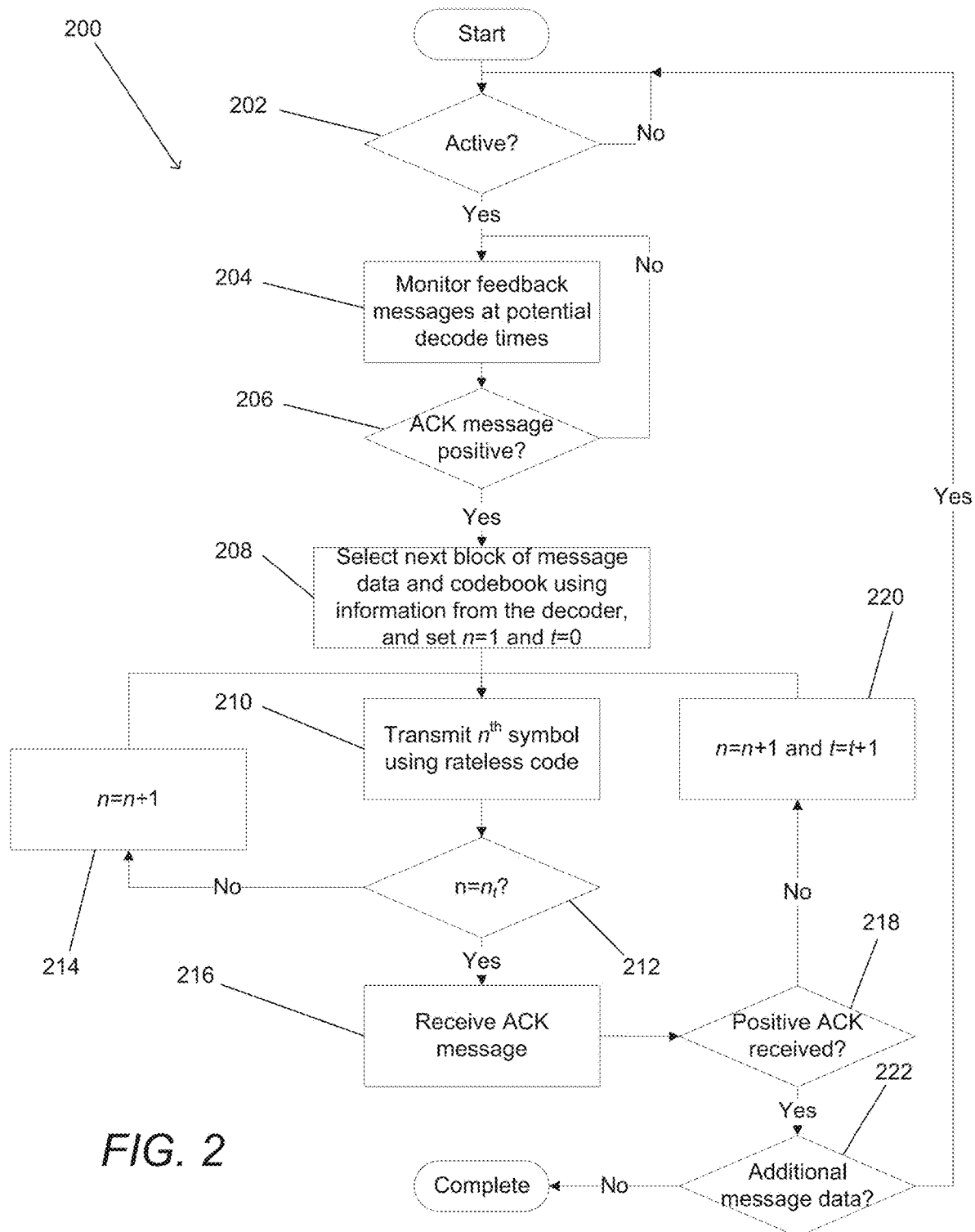
FIG. 2 is a flow chart illustrating a process for transmitting data using a rateless code on a Random Access Channel during epochs defined by a receiver in accordance with an embodiment of the invention.

A process for transmitting data using a rateless code on a RAC during epochs defined by a receiver in accordance with an embodiment of the invention is illustrated in FIG. 2. The process 200 involves the transmitter determining 202 whether or not to become active during the next epoch. When the transmitter wishes to transmit, the transmitter commences monitoring 204 a feedback channel to determine 206 whether the receiver has broadcast a positive ACK message indicating the start time of the next epoch. As noted above, in many embodiments of the invention the receiver is limited to only transmitting feedback messages at a set of times (e.g. the set of potential decoding times) that are known to the transmitter. Accordingly, the transmitter may only monitor the feedback channel at those specific set of times until a positive ACK is received.

The transmitter selects 208 a block of message data to transmit and a codebook to use to encode the message data using a rateless code. In many embodiments, the codebook utilized is a codebook indicated by a receiver and constitutes a common randomness between the transmitter and the receiver. In other embodiments, there is only one codebook, and that same codebook is always used to encode the message data using a rateless code. In certain embodiments, the codebook is the same for every transmitter. In many embodiments, the codebook is specific to the transmitter. In order to encode the message data, the transmitter also resets a clock n that is used to count the number of transmitted symbols and a counter t that is used to index into the set of potential decoding times. As noted above, in some embodiments, the counter t can be considered to correspond to a number of active transmitters. When a receiver determines that t equals the estimated number of active transmitters and n equals the time $n_t$ for decoding when t transmitters are active, the receiver will transmit a positive ACK indicating the end of the epoch. In other embodiments, the counter t can be considered an index identifying a specific subset of distinct encoders. When a receiver determines that t specifies the estimated set of active transmitters and n equals the time $n_t$ for decoding when subset t of the transmitters are active, the receiver will transmit a positive ACK indicating the end of the epoch.

The transmitter transmits 210 the symbols generated by the rateless code based upon the block of message bits and with each transmitted symbols checks 212 to see whether the number of transmitted symbols corresponds to one of the potential decoding times in the set of potential decoding times. If not, then the transmitter increments 214 the clock n=n+1. When the number of transmitted symbols corresponds to a potential decoding time ($n_t$) from the set of potential decoding times, the transmitter listens 216 for an ACK message feedback from the receiver. When a determination 218 is made that the ACK message is a negative ACK message, then the transmitter increments the clock n=n+1 and the counter t–t+1. The transmitter continues to transmit symbols generated by the rateless code until a determination 218 is made that a positive ACK is received. At which point the epoch is over and the transmitter determines 222 whether additional message data is available for transmission and 202 whether the transmitter wishes to be active during the next epoch. When no more message data is available for transmission, the process can complete.

Although specific processes for transmitting data are described above with reference to FIG. 2, any of a variety of processes can be utilized to transmit data as appropriate to the requirements of specific applications in accordance with various embodiments of the invention. Processes for receiving and decoding data transmitted by an unknown number of transmitters via a RAC in accordance with a number of embodiments of the invention are discussed below.

Processes for Decoding Data Transmitted by an Unknown Number of Transmitters Via a RAC Receivers in accordance with various embodiments of the invention are configured to receive data transmitted by an unknown number of transmitters and encoded by rateless codes. In some embodiments, these rateless codes are based upon a common randomness between the transmitter and the receivers. In other embodiments, these rateless codes are fixed. In order to be effective, the receiver must permit the transmitters to transmits symbols for a period of time that is sufficiently long to enable decoding of the transmitted messages with high probability. However, permitting the transmitters to transmit more symbols beyond this required blocklength decreases the rate of the transmitters below capacity of the channel. Accordingly, receivers in accordance with many embodiments of the invention employ decoding rules to determine when a sufficient number of symbols are received to decode the transmitted messages with high probability. In a number of embodiments, a separate potential decoding time is determined for each possible number of active transmitters, and the receiver applies a decoding rule at the each of the potential decoding times to determine whether the transmitted messages can be decoded. In this way, the decoding rule effectively constitutes an attempt to estimate the number of active transmitters. As is discussed below, communication systems in accordance with many embodiments of the invention utilize transmitters that share a common encoder to reduce implementation complexity. In several embodiments, simplicity is traded off for the ability of the receiver to identify the specific messages transmitted by individual transmitters. In a number of embodiments, the receiver can assign a codebook that is specific to a given transmitter to enable identification of the messages transmitted by the transmitter.

The implementation of receivers in accordance with various embodiments of the invention can be influenced by the manner in which the receiver manages the case in which no transmitters are transmitting. The sooner the receiver ends an epoch in which no transmitters are transmitting, the higher the rate achieved across the channel. In a number of embodiments, receivers employ a separate process to determine whether transmitters are active and the receiver simply commences decoding when the receiver knows that transmitters are active. In other embodiments, the receiver incorporates a decoding rule that determines whether any transmitters are active prior to the first potential decoding time period.

Figure 3:
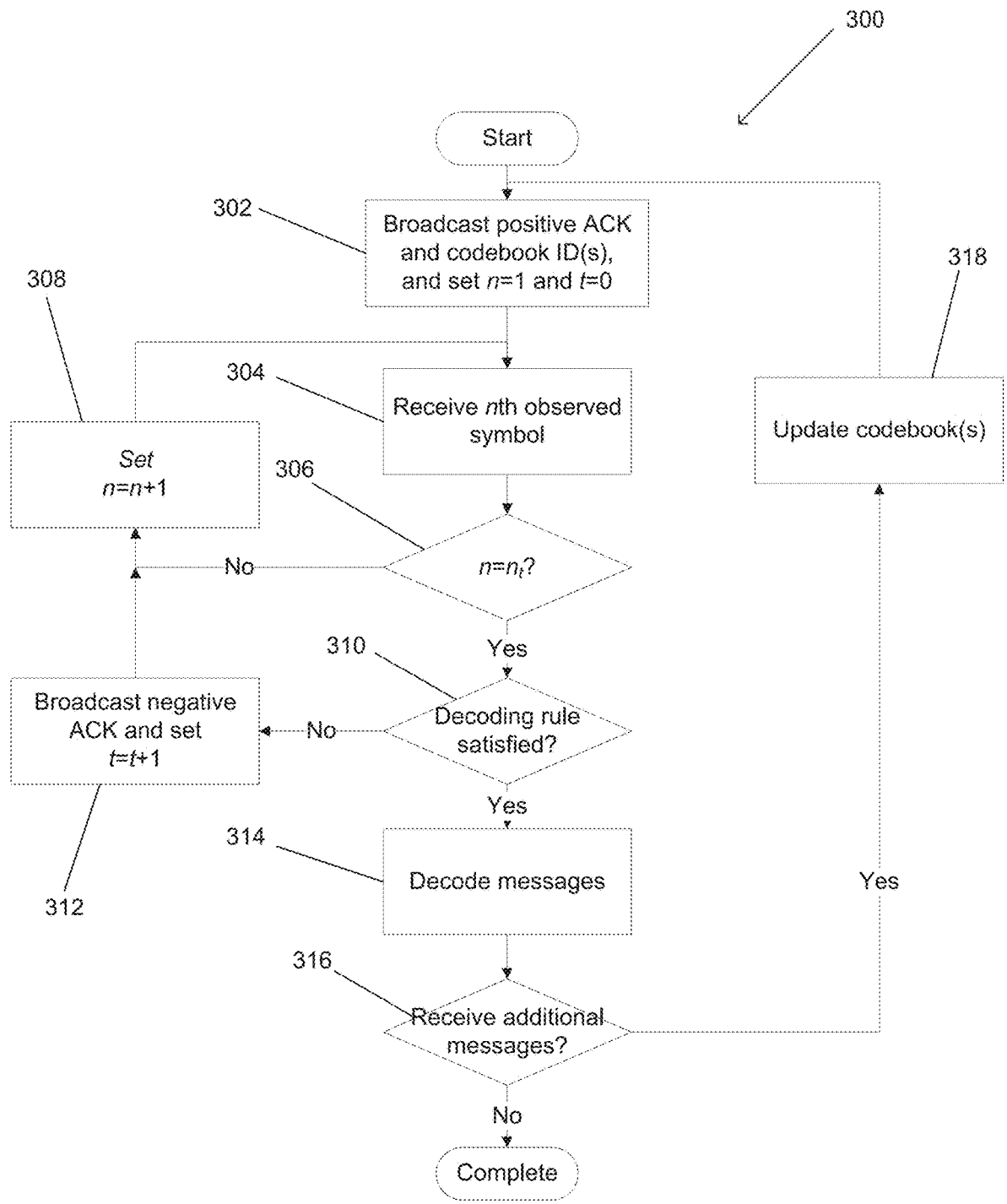
FIG. 3 is a flow chart illustrating a process for detecting whether one or more transmitters are active and/or decoding data transmitted by the one or more active transmitters via a Random Access Channel in accordance with an embodiment of the invention.

A process for detecting whether one or more transmitters are active and/or decoding data transmitted by the one or more active transmitters via a RAC in accordance with an embodiment of the invention is illustrated in FIG. 3. The process 300 commences when the receiver broadcasts 302 a positive ACK feedback message to the transmitters indicating the commencement of an epoch. The positive ACK message can be accompanied by a message indicating one or more codebooks that should be utilized by one, some, or all of the transmitters to encode message data using rateless codes during the epoch.

As part of a process of receiving and decoding symbols, the receiver initializes a clock n that is used to count the number of received symbols and a counter t that is used to index into the set of potential decoding times ($n_t$). As noted above, in some embodiments, the counter t can be considered to correspond to a number of active transmitters. When a receiver determines that t equals the estimated number of active transmitters and $n=n_t$, the receiver will transmit a positive ACK indicating the end of the epoch. In other embodiments, the counter t can be considered an index identifying a specific subset of distinct encoders. When a receiver determines that t specifies the estimated set of active transmitters and n equals the time $n_t$ for decoding when subset t of the encoders are active, the receiver will transmit a positive ACK indicating the end of the epoch.

After the receiver commences receiving observed symbols, the receiver determines 302 whether the number of received symbols corresponds to the potential decoding time ($n_t$) indicated by the counter (t). When the clock indicates that the current time is not one of the potential decoding times, the receiver increments 308 the clock n=n+1 and continues to receive observed symbols. When the clock corresponds to one of the potential decoding times ($n_t$) from the set of potential decoding times indicated by the counter (t), the transmitter determines 310 whether a decoding rule is satisfied. The first potential decoding time ($n_0$) corresponds to a period of time during which the receiver can determine that there are no active transmitters. As is discussed further below, a variety of different decoding rules can be applied at ($n_0$) to determine that there are no active transmitters and at subsequent potential decoding times to estimate the number of active transmitters. In many embodiments, the decoding rule that is utilized to estimate the number of active transmitters during the epoch can be a simple threshold rule that is applied at each potential decoding time after a determination is made that one or more transmitters are active. As is discussed further below, the specific decoding rule applied in a given receiver in accordance with an embodiment of the invention is largely dependent upon the requirements of a given application.

When the decoding rule is not satisfied, the receiver concludes that the subset of transmitters indexed by t is not the estimated active transmitter subset that is currently active and sends a negative ACK to the transmitters. The receiver also increments the counter t=t+1 and the clock n=n+1 and continues to receive observed symbols. When the decoding rule is satisfied, the receiver decodes 314 the messages transmitted by the estimated active transmitter set t and broadcasts a positive ACK feedback message to the transmitters. In some embodiments, the receiver can determine 316 whether it is prepared to initiate another epoch. In the event that the receiver wishes to commence another epoch, the receiver selects 318 one or more codebooks to be utilized by the transmitters during the next epoch and broadcasts 302 a positive ACK message to the transmitters indicating the commencement of the next epoch and specifying the chosen codebook ID(s). In the event that the receiver completes an epoch and does not want to initiate a new epoch, the process completes. In many embodiments, the receiver transmits a positive ACK indicating the end of the epoch (so the transmitters can cease transmission), followed by a message indicating that a new epoch has not commenced.

While a number of specific processes are described above for decoding data, transmitted by an unknown number of transmitters via a RAC using rateless codes with reference to FIG. 3, any of a variety of process can be utilized in the decoding of data transmitted by multiple transmitters using rateless codes during epochs having durations determined by a receiver as appropriate to the requirements of specific applications in accordance with various embodiments of the invention. For example, a positive ACK can indicate both the end of one epoch and the start of another epoch. In many embodiments, the transmitter and receivers commence a new epoch at a fixed time offset from the transmission of a positive ACK message by the receiver. In certain embodiments, the receiver transmits a first positive ACK message to end an epoch and a second message to commence the next epoch. Accordingly, it should be appreciated that receivers in accordance with various embodiments of the invention are not limited to any particular feedback mechanism and/or protocol.

While a variety of communication systems, transmitters, and receivers are described above with reference to FIGS. 1-3, as will be appreciated based upon the discussion below, any of a variety of transmitters and receivers that employ rateless codes can be utilized in accordance with various embodiments of the invention. The discussion that follows presents a variety of approaches that can be utilized to design communication systems and to determine the set of possible decoding times to be utilized by the decoder in decoding the messages from the transmitters in a given application. Furthermore, the threshold that can be applied as a decoding rule in some embodiments is derived. In order to discuss communication systems in accordance with various embodiments of the invention in more detail, it is helpful to define a set of notations that can be helpful in describing the memoryless symmertric random access channel model employed in designing communication systems in accordance with many embodiments of the invention and the resulting communication systems.

Notation

The discussion of the communication systems that follows relies upon a number of notation conventions. Specifically, for any positive integers i,j let $[i]=\{1, \ldots, i\}$ and $[i:j]=\{i, \ldots, j\}$, where $[i:j]=\emptyset$ when $i>j$. For any sequence $x=(x_1, x_2, \ldots)$ and any ordered set $\mathcal{C} \subseteq \mathbb{N}$, vector $x_c \triangleq (x_c : c \in \mathcal{C})$. For any vectors a and b with the same dimension, we write $a \stackrel{\pi}{=} b$ if and only if there exists a permutation $\pi$ of b such that $a=\pi(b)$ and $a \stackrel{\pi}{\neq} b$ if $a \neq \pi(b)$ for all permutations $\pi$ of b. For any set $\mathcal{A}$, $$\binom{\mathcal{A}}{k} = \{\mathcal{B} : \mathcal{B} \subset \mathcal{A}, |\mathcal{B}| = k\}.$$

Memoryless Symmetric Random Access Channel Model

In order to analyze the performance of communication systems in accordance with a number of embodiments of the invention, a memoryless symmetric random access channel model is presented and the performance of various communication systems that employ rateless codes to enable the simultaneous transmission of data by an unknown set of multiple transmitters is considered.

A memoryless symmetric random access channel (henceforth called simply a RAC) is a memoryless channel with one receiver and an unknown number of transmitters. It can be described by a family of stationary, memoryless MACs $$\{(X^k, P_{Y_k|X_{[k]}}(y_k|x_{[k]}), \mathcal{Y}_k)\}_{k=0}^K, \quad (1)$$

each indexed by a number of transmitters, k, where the maximal number of transmitters is K for some $K \leq \infty$. The situation when no transmitters are active (i.e. k=0) is discussed separately below. For $k \geq 1$, the k-transmitter MAC has input alphabet $X^k$, output alphabet $\mathcal{Y}_k$, and conditional distribution $P_{Y_k|X_{[k]}}$. When k transmitters are active, the RAC output is $Y=Y_k$.

By assumption, the impact of a channel input on the channel output is independent of the transmitter from which it comes; therefore each channel in (1) is assumed to be permutation-invariant, giving $$P_{Y_k|X_{[k]}}(y_k|x_{[k]}) = P_{Y_k|X_{[k]}}(y_k|\tilde{x}_{[k]}) \forall \tilde{x}_{[k]} \stackrel{\pi}{=} x_{[k]}. \quad (2)$$

Since, for any $s<k$, MAC-s is physically identical to MAC-k operated with s active and k–s silent transmitters, $0 \in X$ can be used to represent transmitter silence and require reducibility:

$$P_{Y_s|X_{[s]}}(y|x_{[s]}) = P_{Y_k|X_{[k]}}(y|x_{[s]}, 0^{k-s}) \quad (3)$$

for all $s<k$, $x_{[s]} \in X_{[s]}$, and $y \in \mathcal{Y}_s$. An immediate consequence of reducibility is that $\mathcal{Y}_s \subseteq \mathcal{Y}_k$ for any $s<k$. Another consequence is that when no transmitters are active, k=0 and the MAC $(X^0, P_{Y_0|X_{[0]}}(y|x_{[0]}), \mathcal{Y}_0)$ satisfies $X^0 = \{0\}$ and $P_{Y_0|X_{[0]}}(y|x_{[0]}) = P_{Y_k|X_{[k]}}(y|0^k)$ for all k.

As noted above, communication systems in accordance with many embodiments communicate during epochs, where each epoch begins in the time step following the previous epoch's end. In several embodiments, each epoch ends with a positive acknowledgment bit, which the receiver broadcasts to all transmitters as described below. At the beginning of each epoch, each transmitter independently decides whether to be active or silent in that epoch. In certain embodiments, a transmitter is required to either actively transmit for all time steps in the epoch or remain silent for the same period. Thus while the total number of transmitters is potentially unlimited and may change arbitrarily from one epoch to the next, the number of active transmitters, k, stays constant during the entire transmission period between two positive ACKs.

Each transmitter uses the epoch to describe a message W from the alphabet [M]. When the active transmitters are [k], the messages $W_{[k]} \in [M]^k$ are independent and uniformly distributed. The receiver makes a decision at each potential decoding time in the set of potential decoding times $n_0, n_1, \ldots$, whether to end the epoch. At time $n_0$ the receiver ends the epoch if it believes no transmitters are active. In the event the receiver determines that at least one transmitter is active during the epoch, the receiver will end the epoch and decode the transmitted messages at a decode time $n_t$ from the set of potential decoding times $n_0, n_1, \ldots$, when a decoding rule is satisfied. As discussed below, in some embodiments, each decoding time $n_t$ in the set of potential decoding times is selected so that messages transmitted by a number of active transmitters t can be decoded at decode time $n_t$ by the decoder with high probability. Therefore, decoding rules in accordance with many embodiments of the invention attempt to estimate the number of active transmitters t and select a decoding time $n_t$ accordingly. The receiver signals the decoder's decision about when to stop transmitting by broadcasting a single-bit acknowledgment $Z_i$ to all active transmitters at each potential decoding time $n_i$ from the set of potential decoding times $n_0, n_1, \ldots, n_t$ that occurs prior to the end of the epoch; here $Z_i=0$ for all $i<t$ and $Z_t=1$, with "1" signaling the end of one epoch and the beginning of the next.

Agnostic Random Access

It is important to stress that in this domain, each transmitter knows nothing about the set of active transmitters $\mathcal{A} \subset \mathbb{N}$ beyond its own membership and what it learns from the receiver's feedback, and the receiver knows nothing about $\mathcal{A}$ beyond what it learns from the channel output Y; which can be referred to as agnostic random access. In addition, since designing a different encoder for each transmitter is expensive from the perspective of both code design and code operation, communication systems in accordance with many embodiments of the invention employ the same encoder in every transmitter; which can be referred to as identical encoding. Under these assumptions, what the transmitters and receiver can learn about $\mathcal{A}$ is quite limited. In particular, when the properties of permutation-invariance and identical encoding are satisfied, together, they imply that the decoder can at best distinguish which messages were transmitted rather than by whom they were sent. In practice, transmitter identity could be included in the header of each log M-bit message or at some other layer of the stack. Transmitter identity need not, however, be handled by the RAC code (although examples where the RAC code includes transmitter identity are discussed below). Instead, when the channel output statistics depend on the dimension of the channel input but not the identity of the active transmitters, the receiver's task is to decode the messages transmitted but not necessarily the identities of their senders. In these scenarios, it can therefore be assumed without loss of generality that $|\mathcal{A}|=k$ implies $\mathcal{A}=[k]$, and thus the family of k-transmitter MACs in (2) indeed fully describes the behavior of a RAC. While identical encoding and/or permutation-invariance can be utilized to simplify implementation, it should be readily appreciated that these features are by no means requirements of systems in accordance with embodiments of the invention. The various ways in which message data can be encoded in accordance with certain embodiments of the invention is discussed further below.

Employing Rateless Coding to Encode Message Data

The single-bit feedback strategy described above uses rateless coding to deal with the agnostic nature of random access. Specifically, the code design fixes the blocklengths $n_0 \leq n_1 \leq n_2 \leq \ldots \leq n_K$, where in some embodiments, $n_t$ is the decoding blocklength when the decoder believes that the number of active transmitters k is equal to t, and in other embodiments, $n_t$ is the decoding blocklength associated with the subset(s) of active transmitters with the t-th shortest decoding time. With an appropriately designed decoding rule, correct decoding is performed at the time $n_k$ associated with the true subset(s) of active encoders with high probability. Naturally, under the assumptions of permutation-invariance and identical encoding, the greater the number of active transmitters, the longer it takes to decode. For embodiments other than that the assumptions of permutation-invariance and identical encoding are satisfied, the decoding blocklengths for different subsets of active transmitters depend on the number of possible messages and channel qualities from those transmitters. Since the argument employed to bound the performance of our proposed codes relies on a random design algorithm, in some embodiments, we index the family of possible codes by the elements of some set $\mathcal{U}$ and include $u \in \mathcal{U}$ as an argument for both the RAC encoder and the RAC decoder. We then represent random encoding as the application of a code indexed by some random variable $U \in \mathcal{U}$ chosen independently for each new epoch. Deterministic codes are represented under this code definition by setting the distribution on U as $\mathbb{P}[U=u_0]=1$ for some $u_0 \in \mathcal{U}$. The following definition formalizes such rateless codes for agnostic random access.

Definition 1. An $(M, \{(n_k, \epsilon_k)\}_{k=0}^{K})$ RAC code comprises a (rateless) random encoding function $$f: \mathcal{U} \times [M] \to \mathcal{X}^{n_K} \qquad (4)$$

and a collection of random decoding functions:

$$g_k: \mathcal{U} \times \mathcal{Y}_k^{n_k} \to [M]^k \cup e, \; k=0,1,\ldots,K. \qquad (5)$$

At the start of each epoch, a random, variable U on $\mathcal{U}$ with probability distribution $P_U$ is generated independently of the transmitter activity and revealed to the encoders and the decoder. If k transmitters are active, then, with probability at least $1-\epsilon_k$, the k messages are correctly decoded at time $n_k$. If k=0 transmitters are active, the unique message in set $[M]^0=\{0\}$ is decoded at time $n_0$, with probability at least $1-\epsilon_0$. That is, $$\frac{1}{M^k} \sum_{\mathcal{L} \in [M]^k} \mathbb{P}\left[g_k(U, Y_k^{n_k}) \neq \mathcal{L} | W_{[k]} = \mathcal{L}\right] \leq \epsilon_k, \qquad (6)$$

where $W_{[k]}$ are the independent and equiprobable messages of transmitters [k], and the given probability is calculated using the conditional distribution $$P_{Y_k^{n_k}|X_{[k]}^{n_k}} = P_{Y_k|X_{[k]}}^{n_k}$$

where $X_s^{n_k} = f(U, W_s)_{[n_k]}, s=1, \ldots, k$.

Implementing a RAC code with random code choice U can, in some embodiments, be accomplished by treating the random variable U as common randomness available to the transmitters and the receiver that specifies the codebook U used in the current epoch. One means of operationally implementing this common randomness is to allow the receiver to choose random instance U at the start of each epoch and broadcast that value to the transmitters just after the ACK bit that ends the previous epoch. While broadcasting the value of U increases the epoch-ending feedback from 1 bit to $[\log|\mathcal{U}|]+1$ bits, the bound $|\mathcal{U}| \leq K+1$ on the size of the alphabet of U applies in some embodiments, ensuring that the feedback required remains small when $K<\infty$. When $|\mathcal{U}|=1$, the single codebook is fixed and known, and $\log|\mathcal{U}|=0$, meaning that no codebook description is needed. At the start of each epoch, transmitters decide whether to be active or silent independently of the codebook indicated by the $\log|\mathcal{U}|$-bit string. We employ a general random coding argument to show that a given error vector $(\epsilon_0, \ldots, \epsilon_K)$ is achievable when averaged over the ensemble of codes. Unfortunately, this traditional approach does not show the existence of a deterministic RAC code, i.e. a code with $|\mathcal{U}|=1$, that achieves the given error vector $(\epsilon_0, \ldots, \epsilon_K)$, since showing that the random code's expected error probability meets each of our K+1 error constraints, does not show directly that any of the codes in the ensemble meets all of our error constraints simultaneously. Nonetheless, in some embodiments of the invention, $|\mathcal{U}|$ is set to 1 and a single, fixed code is employed. The manner in which sets of potential decoding times or decoding lengths can be developed for RACs with different characteristics in accordance with various embodiments of the invention is discussed further.

The code model introduced in Definition 1 employs identical encoding in addition to common randomness. Under identical encoding, each transmitter uses the same encoder, $f$, to form a codeword of length $n_K$ ($n_K \leq \infty$). In the absence of identical encoding and/or permutation invariance, a system may employ as many as $2^K-1$ different decode times, with the codeword lengths being equal the longest of the decode times.

A transmitter transmits a codeword via the channel symbol by symbol. According to Definition 1, if k transmitters are active, then with probability at least $1-\epsilon_k$, the decoder recovers the sent messages correctly after observing the first $n_k$ channel outputs. As noted previously, the decoder $g_k$ does not attempt to recover transmitter identity when identical encoding is utilized by the transmitters; successful decoding means that the list of messages it outputs coincides with the list of messages sent.

Determining Sets of Potential Decoding Times

The following definitions are useful for the discussion that follows. When k transmitters are active, marginal distribution $P_{Y_k}$ is determined by input distribution $P_{X_{[k]}}$. The information density and conditional information density are defined as $$i_k(x_{\mathcal{A}}; y_k) \triangleq \log \frac{P_{Y_k|X_{\mathcal{A}}}(y_k|x_{\mathcal{A}})}{P_{Y_k}(y_k)} \tag{7}$$

$$i_k(x_{\mathcal{A}}; y_k | x_{\mathcal{B}}) \triangleq \log \frac{P_{Y_k|X_{\mathcal{A}},X_{\mathcal{B}}}(y_k|x_{\mathcal{A}},x_{\mathcal{B}})}{P_{Y_k|X_{\mathcal{B}}}(y_k|x_{\mathcal{B}})} \tag{8}$$

for any $\mathcal{A}, \mathcal{B} \subseteq [k]$, $x_{\mathcal{A}} \in X_{\mathcal{A}}$, $x_{\mathcal{B}} \in X_{\mathcal{B}}$, and $y_k \in \mathcal{Y}_k$; here $i_k(x_{\mathcal{A}}; y_k | x_{\mathcal{B}}) \triangleq i_k(x_{\mathcal{A}}; y_k)$ when $\mathcal{B} = \emptyset$ and $i_k(x_{\mathcal{A}}; y_k | x_{\mathcal{B}}) \triangleq 0$ when $y_k \notin \mathcal{Y}_k$ or $\mathcal{A} = \emptyset$. The corresponding mutual informations are $$I_k(X_{\mathcal{A}}; Y_k) \triangleq \mathbb{E}[i_k(X_{\mathcal{A}}; Y_k)] \tag{9}$$

$$I_k(X_{\mathcal{A}}; Y_k | X_{\mathcal{B}}) \triangleq \mathbb{E}[i_k(X_{\mathcal{A}}; Y_k | X_{\mathcal{B}})]. \tag{10}$$

The following is used for brevity throughout the discussion that follows $$I_k \triangleq I_k(X_{[k]}; Y_k), \tag{11}$$

$$V_k \triangleq \mathrm{Var}[i_k(X_{[k]}; Y_k)]. \tag{12}$$

Since the decoder does not know the number of transmitters (k), the decoder may evaluate the information density $i_t(x_{\mathcal{A}}; y_k)$ for more than one candidate value t of the number of transmitters. The expected value of the $t^{th}$ information density $i_t(x_{\mathcal{A}}; y_t)$ evaluated on channel output $Y_k$ is denoted by $\mathbb{E}[i_t(X_{\mathcal{A}}; Y_k)]$.

To ensure the existence of codes satisfying the error constraints in Definition 1, it is assumed that there exists a $P_X$ such that when $X_1, X_2, \ldots, X_K$ are distributed i.i.d. $P_X$, then the conditions in (13)-(18) below are satisfied. It is important to note that these assumptions are made to assist with analysis and that systems and methods in accordance with various embodiments of the invention are not necessarily constrained by these assumptions. Indeed, the specific manner in which a system or method in accordance with an embodiment of the invention is implemented will largely depend upon the requirements of a given application.

The friendliness assumption states that for all k≤K, $$I_k(X_{[s]}; Y_k | X_{[s+1:k]} = 0^{k-s}) \geq I_k(X_{[s]}; Y_k | X_{[s+1:k]}). \tag{13}$$

Friendliness implies that a transmitter that remains silent is at least as good from the perspective of the decoder as a transmitter that reveals its transmission to the decoder. Naturally, (13) can always be satisfied with an appropriate designation of the "silence" symbol.

The interference assumption states that for any s and t, $X_{[s]}$ and $X_{[s+1:t]}$ are conditionally dependent given $Y_k$, giving $$P_{X_{[t]}|Y_k} \neq P_{X_{[s]}|Y_k} P_{X_{[s+1:t]}|Y_k} \ \forall 1 \leq s < t \leq k, \in k. \tag{14}$$

Assumption (14) eliminates all trivial RACs in which different transmitters do not interfere.

In order to distinguish the time-$n_0$ output $Y_0^{n_0}$, when no transmitters are active, from the time-$n_0$ output $Y_k^{n_0}$, when k≥1 transmitters are active, we assume that the output distributions satisfy $$P_{Y_0} \neq P_{Y_k} \tag{15}$$

for all k≥1, where $P_{Y_k}$ is the output distribution of the channel $P_{Y_k|X_{[k]}}$ under the input distribution $P_X^k$ for k≥1 and $P_{Y_0} = P_{Y_0|X_{[0]}}$ is the output distribution with no active transmitter. It is important to notice that this assumption is only needed to detect the scenario when no transmitters are active; the remainder of the code functions proceed unhampered when (15) fails. Therefore, we can design codes for such scenarios we can design codes for such scenarios either by setting $\epsilon_0 = 1$ or employing other mechanisms, such as a short start-up phase prior to encoding in which active encoders signal their presence, for determining whether k=0.

Finally, the following moment assumptions enable the second-order analysis presented in Theorem 1 below:

$$\mathrm{Var}[i_k(X_{[k]}; Y_k)] > 0 \tag{16}$$

$$\mathbb{E}[|i_k(X_{[k]}; Y_k) - I_k(X_{[k]}; Y_k)|^3] < \infty. \tag{17}$$

Furthermore, in the case when $i_t(X_{[s]}; Y_k) > -\infty$ almost surely, it should also be required that $$\mathrm{Var}[i_t(X_{[s]}; Y_k)] < \infty \ \forall s \leq t \leq k. \tag{18}$$

All discrete memoryless channels (DMCs) satisfy (17)-(18) as do Gaussian noise channels. Common channel models from the literature typically satisfy (16) as well.

Example channels meeting (2), (3), (13)-(18) include: the Additive White Gaussian Noise (AWGN) RAC, $$Y_k = \sum_{i=1}^{k} X_i + Z, \tag{19}$$

where each $X_i \in \mathbb{R}$ operates under a power constraint P and $Z \sim \mathcal{N}(0, N)$ for some N>0; and the adder-erasure RAC, $$Y_k = \begin{cases} \sum_{i=1}^{k} X_i, & \text{w.p. } 1-\delta \\ e & \text{w.p. } \delta, \end{cases} \tag{20}$$

where $X_i \in \{0,1\}$ and $Y_k \in \{0, \ldots, k\} \cup e$.

For the AWGN RAC, $i_t(X_{[s]}; Y_k) > -\infty$ almost surely and (18) is satisfied, while for the adder-erasure RAC, $i_t(X_{[s]}; Y_k) = -\infty$ for some channel realizations and user activity patterns, and (18) is not required.

A series of lemmata that describe the natural orderings possessed by RACs that satisfy (2), (3), (13), and (14) can be articulated. These properties are key to the feasibility of various examples of the achievability scheme described herein, which appears in the next section. It is important to appreciate that while these features are helpful to analyzing the performance of a certain class of systems and methods, the inventions disclosed herein are by no means limited to these simplifying assumptions. Accordingly, it should be understood that systems and methods implemented in accordance with embodiments of the invention are not limited to these requirements and can be implemented in any manner appropriate to the requirements of a given application.

The first lemma shows that the quality of the channel for each active transmitter deteriorates as more transmitters join (even though the sum capacity may increase).

Lemma 1. Let $X_1, X_2, \ldots, X_k$ be i.i.d. Under permutation-invariance (2), reducibility (3), friendliness (13), and interference (14), $$\frac{I_k}{k} < \frac{I_s}{s} \text{ for } k > s \geq 1. \tag{21}$$

The second lemma shows that a similar relationship holds even when the number of transmitters is fixed.

Lemma 2. Let $X_1, X_2, \ldots, X_k$ be i.i.d. Under permutation-invariance (2), reducibility (3) and interference (14), $$\frac{1}{k} I_k(X_{[k]}; Y_k) < \frac{1}{s} I_k(X_{[s]}; Y_k \mid X_{[s+1:k]}) \text{ for } k > s \geq 1. \tag{22}$$

The third lemma compares the expected values of the mutual information density computed under various possible channels and conditional distributions observed by the decoder.

Lemma 3. Let $X_1, X_2, \ldots, X_k$ be i.i.d. If a RAC is permutation-invariant (2), reducible (3), friendly (13), and exhibits interference (14), then for any $1 \leq s \leq t < k$, we have $$\mathbb{E}[i_t(X_{[s]}; Y_k)] \leq I_k(X_{[s]}; Y_k) < I_t(X_{[s]}; Y_t). \tag{23}$$

It is the orderings in Lemma 1-3 that enable analysis of the case of agnostic multiple access. As noted above, the Lemmas do not constitute limitations on the manner in which practical systems and methods in accordance with various embodiments of the invention can be implemented.

Theoretical Performance Bound for RAC Codes

In order to evaluate the performance of communication systems that employ rateless codes to communicate on a RAC using techniques similar to those described herein, it is helpful to develop an understanding of the theoretically achievable performance of such a system. Theorem 1 bounds the performance of a finite blocklength RAC code. For any number $k \geq 1$ of active transmitters, the code achieves a rate vector $R_{[k]} = (R, \ldots, R)$, $$R = \frac{\log M}{n_k},$$

with sum-rate $kR$ converging as $$O\left(\frac{1}{\sqrt{n_k}}\right)$$

to $I_k(X_{[k]}; Y_k)$ for some input distribution $P_{X_{[k]}}(x_{[k]}) = \Pi_{i=1}^{k} P_X(x_i)$ with $P_X(x)$ independent of k. For any family of MACs for which a single $P_X$ maximizes $I_k(X_{[k]}; Y_k)$ for all k, the rate of the proposed sequence of codes converges to the symmetrical rate point on the capacity region of the MAC with the same number of transmitters.

Theorem 1. (Achievability) For any RAC $$\{(\mathcal{X}^k, P_{Y_k \mid X_{[k]}}(y_k \mid x_{[k]}), \mathcal{Y}_k)\}_{k=0}^{K},$$

satisfying (2), (3), any $K < \infty$ and any fixed $P_X$ satisfying (13)-(18), there exists an $(M, \{(n_k, \epsilon_k)\}_{k=0}^{K})$ code provided that $$\log M \leq \frac{1}{k} \left\{ n_k I_k - \sqrt{n_k V_k} \, Q^{-1}(\epsilon_k) - \frac{1}{2} \log n_k + O(1) \right\}, \tag{24}$$

for all $1 \leq k \leq K$, and $$n_0 \geq O(\log n_1), \tag{25}$$

where $$Q(x) \triangleq \frac{1}{\sqrt{2\pi}} \int_x^{\infty} \exp\left\{\frac{-u^2}{2}\right\}$$

du is the Gaussian complementary cumulative distribution function.

To shed light on the statement of Theorem 1, consider a channel satisfying (13)-(18) for which the same distribution $P_X$ achieves the maximum of $I_k$ for all k. For example, for the adder-erasure RAC in (20), Bernoulli-½ $P_X$ attains max $I_k$ for all k. Thanks to Lemma 1, for M large enough and any $\epsilon_1, \epsilon_2, \ldots, \epsilon_K$, one can pick $n_1 < n_2 < \ldots < n_K$ so that the right side of (24) is equal to log M, for all k.

Therefore, somewhat counter-intuitively, Theorem 1 certifies that for some channels, rateless codes with encoders that are, until acknowledgment, agnostic to the transmitter activity pattern perform as well (in both first and second order terms in (24)) as the best known transmission scheme designed with complete knowledge of transmitter activity. Moreover, the state of no active transmitters is correctly detected at time $n_0 = O(\log n_1)$, with probability $1 - \epsilon_0$, for any fixed $0 < \epsilon_0 < 1$, allowing a new epoch to begin very quickly when no transmitters are active in the current epoch.

The achievable error region given in Theorem 1 is consistent with the general achievability results for 2-transmitter MACs (when no time-sharing is allowed). For the 2-transmitter MAC, the second-order achievability region is expressed in terms of dispersion matrix, $V_2$, defined as the covariance matrix of the random vector $$\iota_2 \triangleq \begin{bmatrix} \iota_2(X_1; Y \mid X_2) \\ \iota_2(X_2; Y \mid X_1) \\ \iota_2(X_1, X_2; Y) \end{bmatrix}. \tag{26}$$

Let Z be a k-dimensional Gaussian vector with mean 0 and covariance matrix K. For $\epsilon \in (0,1)$, define the multidimensional counterpart of the $Q^{-1}$ function $$Q_{inv}(K, \epsilon) \triangleq \{\tau \in \mathbb{R}^k : \mathbb{P}[Z \leq \tau] \geq 1 - \epsilon\}. \tag{27}$$

It can be shown that the achievable rate region satisfies $$R_1, \tag{28}$$

$$R_2 : \begin{bmatrix} R_1 \\ R_2 \\ R_1 + R_2 \end{bmatrix} \supseteq \bigcup_{P_{X_1}, P_{X_2}} \left\{ \mathbb{E}[\iota_2] - \frac{1}{\sqrt{n}} Q_{inv}(V_2, \epsilon) + O\left(\frac{\log n}{n}\right) 1 \right\}.$$

For the rate points $(R_1, R_2)$ lying on the sum-rate boundary, the achievable region defined in (28) reduces to the following scalar inequality which is consistent with Theorem 1.

$$R_1 + R_2 \le I_2(X_1, X_2; Y) - \sqrt{\frac{V_2}{n}} Q^{-1}(\epsilon) + O\left(\frac{\log n}{n}\right), \quad (29)$$

where $V_2 = \text{Var}[i_2(X_1, X_2; Y)]$.

Although time-sharing is not included in the coding strategies described above, it is worth mentioning that there exist RACs such that the equal rate point of the capacity region can only be achieved by time-sharing. As an example, consider the following permutation-invariant, 2-transmitter MAC with input and output alphabets $X_1 = X_2 = \mathcal{Y} = \{0,1\}$:

$$P_{Y|X_1 X_2}(0 | 0, 0) = P_{Y|X_1 X_2}(1 | 0, 1) = P_{Y|X_1 X_2}(1 | 1, 0) = 1$$

$$P_{Y|X_1 X_2}(1 | 1, 1) = \frac{1}{2}.$$

Let the inputs be $X_1 \sim \text{Bern}(p_1)$ and $X_2 \sim \text{Bern}(p_2)$ and be independent of each other. For this channel, the equal rate point (½, ½) can be achieved by taking the convex combination of achievable points (0,1) and (1,0); however, no $(p_1, p_2)$ achieves (½, ½). The issue with performing time-sharing in the code design is that the required time-sharing random variable U may depend on the number of active transmitters; therefore, a different codebook would be necessary for each possible number of active transmitters. To solve this issue, a training phase can be employed, in which each of the active transmitters sends a pre-determined training sequence to the decoder and the decoder feeds back its estimate t of the active transmitters at the end of the training phase to the encoders. By the knowledge of the number of active transmitters, time-sharing that achieves the target rate point can be determined and the codebook can be formed accordingly.

Achievable Rates for Adder-Erasure RAC

The following example investigates the achievable rates of the adder-erasure RAC in (20).

Example 1

For the adder-erasure RAC, the capacity achieving distribution is the equiprobable (Bernoulli-½) distribution for all k. Although one can exactly calculate $I_k$ and $V_k$ for this channel for a fixed k (see FIG. 4 and FIG. 5), it is more insightful to consider the following characterization:

$$I_k(X_{[k]}; Y_k) = (1 - \delta)\left(\frac{1}{2}\ln\frac{\pi e k}{2} - \frac{1}{12k^2}\right) + O(k^{-3}) \text{ nats} \quad (30)$$

$$V_k(X_{[k]}; Y_k) = \quad (31)$$

$$(1 - \delta)\left[\frac{\delta}{4}\ln^2\frac{\pi e k}{2} + \frac{1}{2} - \frac{1}{2k} - \left(\frac{1}{2} + \frac{\delta \ln\frac{\pi e k}{2}}{12}\right)\frac{1}{k^2}\right] + O\left(\frac{\ln k}{k^3}\right) \text{ nats}^2.$$

Figure 4:
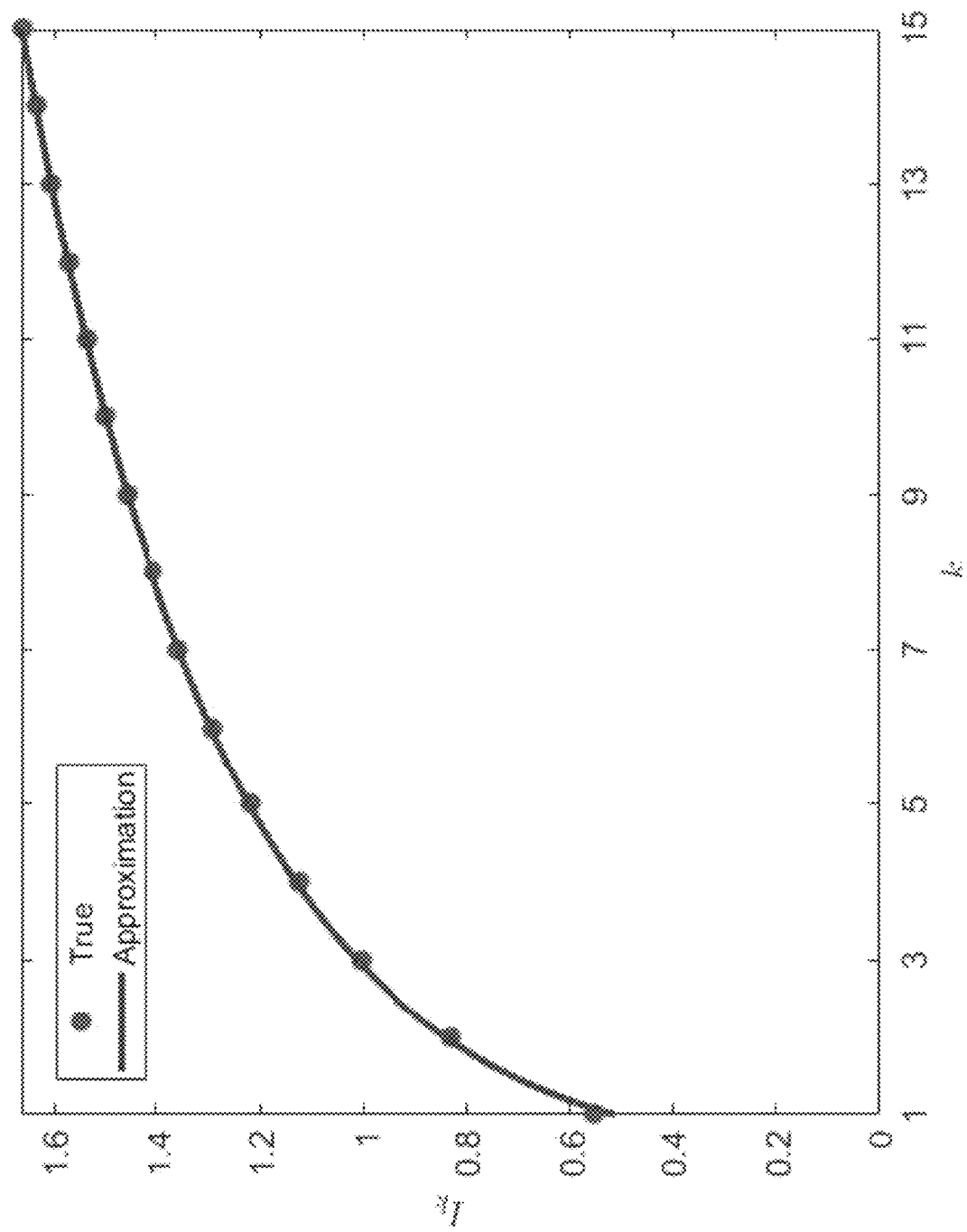
FIG. 4 is a chart illustrating sum-rate capacity $I_k$ achievable by a system in accordance with an embodiment of the invention in nats for the adder-erasure RAC with $\delta=0.2$.
Figure 5:
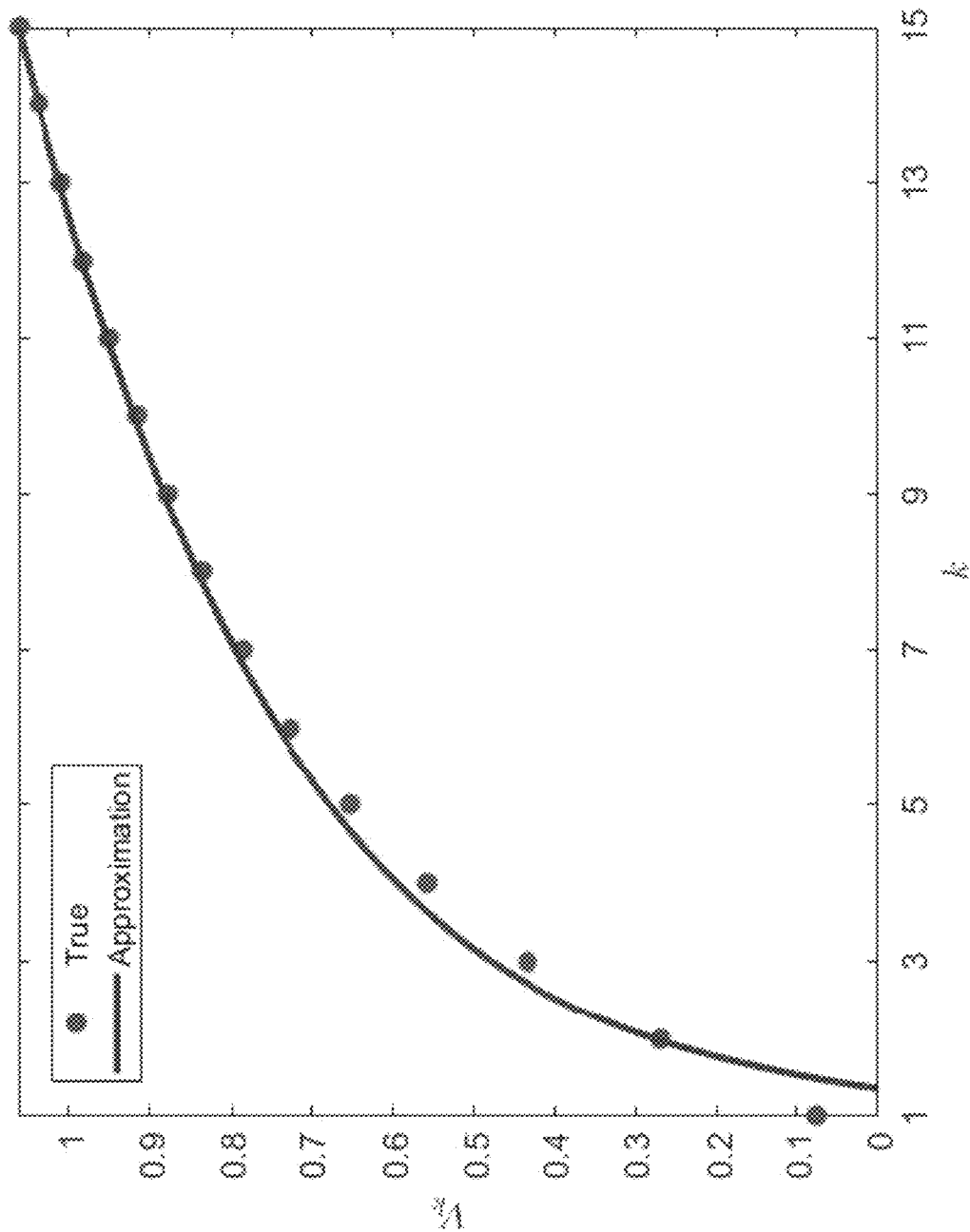
FIG. 5 is a chart illustrating dispersion $V_k$ achievable by a system in accordance with an embodiment of the invention in nats² for the adder-erasure RAC with $\delta=0.2$.

Dropping the O(·) terms, the approximations (30)-(31) are quite tight even for small k, as shown in FIG. 4 and FIG. 5.

These approximations capture the first- and second-order behavior of $I_k$ and $V_k$ in k and demonstrate how each depends on k and δ. Namely, both $I_k$ and $\sqrt{V_k}$ are of order $O(\ln k)$, indicating that as k grows, the sum-rate capacity grows (albeit slowly, so that the per-user rate vanishes as $$O\left(\frac{\ln k}{k}\right)),$$

while the dispersion $V_k$ also grows, and the speed of approach to the sum-rate capacity is slower. Interestingly, the dispersion behavior is different for the pure adder RAC (δ=0), in which case $$V_k = \frac{1}{2} + O\left(\frac{1}{k}\right)$$

is almost constant as a function of k. The derivation of (30) and (31) relies on an approximation for the probability mass function of the $$\left(k, \frac{1}{2}\right)$$

Binomial distribution using a higher order Stirling's approximation.

Figure 6:
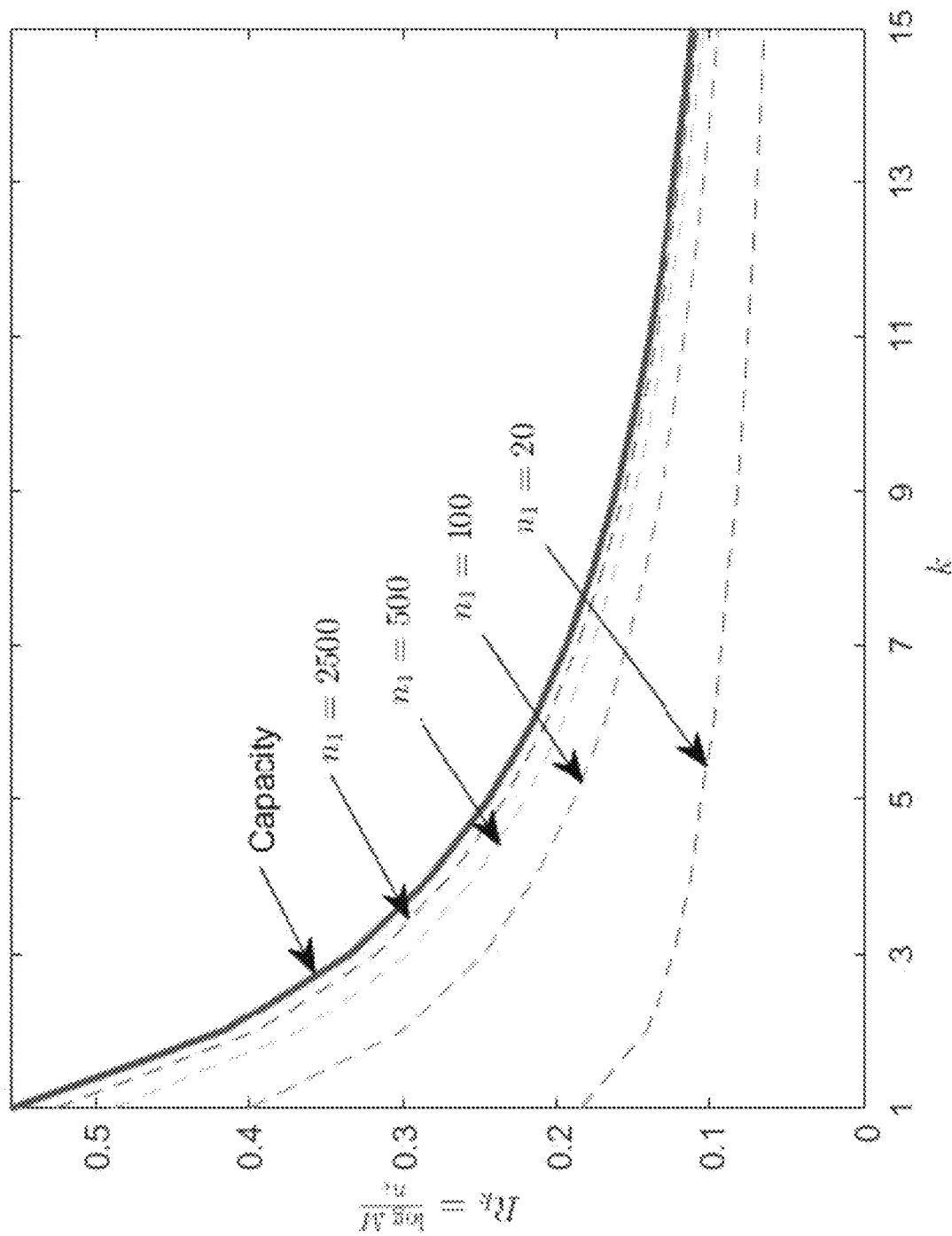
FIG. 6 is a chart illustrating the capacity and achievable rates per user $$\left\{R_k = \frac{\log M}{n_k}\right\}_{k=1}^{15}$$

FIG. 6 shows the rate per transmitter, $$R_k = \frac{\log M}{n_k},$$

achieved by the proposed scheme as a function of the number of active transmitters, k, and the choice of blocklength $n_1$ for a fixed error probability $\epsilon_k = 10^{-6}$ for all k. Fixing $n_1$ and $\epsilon_k$ fixes the maximum achievable message size, M, according to (24) and the remaining $n_k$ for k≥2 are found by choosing $n_k$ to achieve equality in (24) using the given M and $\epsilon_k$. Each curve illustrates the decrease in the rate per transmitter ($R_k$) as the number of active users k increases. The curves differ in their choice of blocklength $n_1$ when 1 user is active (and the resulting changes in M and $n_0$, $n_2, \ldots, n_K$); here $n_1$ is fixed to 20, 100, 500 and 2500. For a fixed k, the points on the same vertical line demonstrate how the gap between the per-user capacity and the finite-blocklength achievable rate decreases as blocklength is increased.

Theorem 1 follows from Theorem 2, which bounds the error probability of the finite-blocklength RAC code defined below. When k transmitters are active, the error probability $\epsilon_k$ captures both errors in the estimate t of k and errors in the reproduction $\hat{W}_{[t]}$ of $W_{[k]}$ when t=k. Theorem 2 below is formulated for an arbitrary choice of the statistic $h: \mathcal{Y}^n \mapsto \mathbb{R}$ used to decide whether there are any active transmitters.

Theorem 2. For any RAC $\{(X^k, P_{Y_k|X_{[k]}}(y_k|x_{[k]}), \mathcal{Y}_k)\}_{k=1}^K$ satisfying (2) and (3), any $K \leq \infty$, and a fixed input distribution $P_X$, there exists an $(M, \{(n_k, \epsilon_k)\}_{k=0}^K)$ code with $$\epsilon_0 \leq \mathbb{P}[h(Y_0^{n_0}) > \gamma_0] \tag{32}$$

$$\epsilon_k \leq \mathbb{P}[i_k(X_{[k]}^{n_k}; Y_k^{n_k}) \leq \log \gamma_k] \tag{33}$$

$$+ \mathbb{P}[h(Y_k^{n_0}) \leq \gamma_0] \tag{34}$$

$$+ 1 - \frac{\prod_{i=1}^{k-1}(M-i)}{M^k} \tag{35}$$

$$+ \sum_{t=1}^{k-1}\binom{k}{t}\mathbb{P}[i_t(X_{[t]}^{n_t}; Y_k^{n_t}) > \log \gamma_t] \tag{36}$$

$$+ \sum_{t=1}^{k}\sum_{s=1}^{t-1}\binom{k}{t-s}(\mathbb{P}[i_t(X_{[s+1:t]}^{n_t}; Y_k^{n_t}) \tag{37}$$
$$> n_t \mathbb{E}_{\nu}[i_t(X_{[s+1:t]}; Y_k)] + \lambda_{s,t}^k])$$

$$+ \sum_{t=1}^{k}\sum_{s=1}^{t}\binom{k}{t-s}\binom{M-k}{s}(\mathbb{P}[i_t(\bar{X}_{[s]}^{n_t}; Y_k^{n_t}|X_{[s+1:t]}) \tag{38}$$
$$> \log \gamma_t - n_t \mathbb{E}_{\nu}[i_t(X_{[s+1:t]}; Y_k)] - \lambda_{s,t}^k])$$

for all $k \geq 1$, where the $\lambda_{s,t}^k$ and $\gamma_t$ values are constants, and for any $n$, $(X_{[k]}^n, \bar{X}_{[k]}^n, Y_k^n)$ represents a random sequence drawn i.i.d. according to $P_{X_{[k]}\bar{X}_{[k]}Y_k}(x_{[k]}, \bar{x}_{[k]}, y_k) = (\Pi_{i=1}^k P_X(x_i)P_X(\bar{x}_i))P_{Y_k|X_{[k]}}(y_k|x_{[k]})$.

For $k=0$, the only error term in (32) is the probability that the decoder does not correctly estimate that the number of active transmitters as 0 at time $n_0$. For $k \geq 1$, in the operational regime of interest, that is when (24) is satisfied with equality, the dominating term is (33), which is the probability that the true codeword set produces a low information density. The remaining terms can all be shown to be negligible. The remaining terms bound the probability that: the decoder incorrectly estimates the number of active transmitters as 0 (34); the probability that two or more transmitters send the same message (35); the probability that the decoder estimates the number of active transmitters as t for some $1 \leq t < k$ and decodes those t messages correctly (36); and the probability that the decoder estimates the number of active transmitters as t for some $1 \leq t \leq k$ and decodes the messages from s of those t transmitters incorrectly and the messages from the remaining t–s of those transmitters correctly (37)-(38). While specific operational regimes of interest are described above, it should be readily appreciated that operational regimes of systems and methods in accordance with embodiments of the invention are not limited to these regimes and can be operated in any manner that is appropriate to the requirements of a given application.

One advantage of Theorem 2 is that the bound on the error probability for k active transmitters is not a function of the maximum number of active transmitters, K; it only depends on the RACs up to k active transmitters. For k=1,2, the expression in (33)-(38) particularizes to $$\epsilon_1 \leq \mathbb{P}[i_1(X_1^{n_1}; Y_1^{n_1}) \leq \log \gamma_1] +$$
$$\mathbb{P}[h(Y_1^{n_0}) \leq \gamma_0] + (M-1)\mathbb{P}[i_1(\bar{X}_1^{n_1}; Y_1^{n_1}) > \log \gamma_1 - \lambda_{1,1}^1],$$

$$\epsilon_2 \leq \mathbb{P}[i_2(X_{[2]}^{n_2}; Y_2^{n_2}) \leq \log \gamma_2] + \mathbb{P}[h(Y_2^{n_0}) \leq \gamma_0] + \frac{1}{M} +$$
$$2[\mathbb{P}[i_1(X_1^{n_1}; Y_2^{n_1}) > \log \gamma_1] + 2[\mathbb{P}[i_2(X_2^{n_2}; Y_2^{n_2}) \geq n_2 I_2(X_2; Y_2) + \lambda_{1,2}^2] +$$
$$(M-1)\mathbb{P}[i_1(\bar{X}_1^{n_1}; Y_2^{n_1}) > \log \gamma_1 - \lambda_{1,1}^1] +$$
$$2(M-2)\mathbb{P}[i_2(\bar{X}_1^{n_2}; Y_2^{n_2}|X_2) > \log \gamma_2 - n_2 I_2(X_2; Y_2) - \lambda_{1,2}^2] +$$
$$\frac{(M-2)(M-3)}{2}\mathbb{P}[i_2(\bar{X}_{[2]}^{n_2}; Y_2^{n_2}) > \log \gamma_2 - \lambda_{2,2}^2].$$

The following presents an upper-bound on the sum-rate with blocklength n and average error probability $\epsilon$, for 2-transmitter DM-MAC:

$$n(R_1 + R_2) \leq nI(X_1, X_2; Y) + c(\epsilon)\sqrt{n}\log n, \tag{39}$$

where $$c(\epsilon) = \frac{6|\mathcal{X}_1||\mathcal{X}_2||\mathcal{Y}| + 2\epsilon}{1-\epsilon} + \log\frac{1+\epsilon}{1-\epsilon} + C \tag{40}$$

and C is a positive constant depending on $X_1, X_2, \mathcal{Y}$.

A description of the proposed RAC code and the proofs of Theorems 1 and 2 appear in U.S. Provisional Patent Application Ser. No. 62/797,089, the disclosure of which is incorporated by reference above.

The RAC Code and Its Performance

In a number of embodiments of the invention, an encoder design is utilized based upon defining the finite-blocklength RAC code used in the proofs of Theorem 1 and Theorem 2 as follows.

Exemplary Encoder Design: the common randomness random variable can be specified as follows $U=(U_1, \ldots, U_M)$ as $$\mathcal{U} \triangleq \mathcal{U}_1 \times \ldots \times \mathcal{U}_M \tag{41}$$

$$P_U \triangleq P_{U_1} \times \ldots \times P_{U_M} \tag{42}$$

where $\mathcal{U}_i = X^{n_K}$ and $P_{U_i} = P_X^{n_K}$ for $i=1, \ldots, M$, and $P_X$ is a fixed distribution on alphabet X. Note that the cardinality of $\mathcal{U}$ is $|X|^{Mn_K}$; however, $|\mathcal{U}|$ can be bounded by K+1. The realization of U defines M i.i.d. vectors $U_1, \ldots, U_M$ with length $n_K$. The encoder $f(U,\cdot)$ depends on U as $$f(U,w) = U_w \text{ for } w=1, \ldots, M. \tag{43}$$

For brevity, U is omitted in the encoding function, which is written as $f(U,w) = f(w)$ for $w=1, \ldots, M$.

As described above, in some embodiments, an $(M, \{(n_k, \epsilon_k)\}_{k=0}^K)$ RAC code can employ the same encoder $f(\cdot)$ at every transmitter. For any $w_{[k]} \in [M]^k, f(w_{[k]})$ can be used to denote the encoded description of $w_{[k]}$, giving $f(w_{[k]}) = (f(w_1), \ldots, f(w_k))$.

The analysis that follows employs Shannon's random encoder design with codewords drawn i.i.d. as $$f(1), f(2), \ldots, f(M) \sim i.i.d. \prod_{i=1}^{n_K} P_X(x_i). \quad (44)$$

Exemplary Decoder Design: Upon receiving $n_0$ i.i.d. samples of the output Y, the decoder runs the following composite hypothesis test to decide whether there are any active transmitters:

$$g_0(U, y^{n_0}) = \begin{cases} 0 & \text{if } h(y^{n_0}) \leq \gamma_0 \\ e & \text{otherwise.} \end{cases} \quad (45)$$

Here, 0 signifies that the "silence" message has been decoded and a positive ACK is sent to all transmitters signifying the start of a new coding epoch, while e means that there are active transmitters, and thus the transmission must continue and a negative ACK is sent to all transmitters.

For each $k \geq 1$, after observing the output $y^{n_k}$, decoder $g_k$ employs a single threshold rule $$g_k(U, y^{n_k}) = \begin{cases} w_{[k]} & \text{if } i_k(f(w_{[k]})_{[n_k]}; y^{n_k}) > \log \gamma_k \\ & \text{and } w_i < w_j \, \forall \, i < j \\ e & \text{otherwise} \end{cases} \quad (46)$$

for some constant $\gamma_k$ chosen before the transmission starts. The transmission stops and a positive ACK is sent to all transmitters once a non-erasure is decoded in (46). For $k \geq 1$, the decoder $g_k(U, y^{n_k})$ depends on U through the encoding function $f(w_{[k]})$, while $g_0(U, y^{n_0})$ does not depend on U. For brevity, in both cases, the following notation is employed: $g_k(U, y^{n_k}) = g_k(y^{n_k})$.

By permutation-invariance (2) and identical encoding, all permutations of the message vector $w_{[k]}$ give the same mutual information density. The ordered permutation specified in (46) can be used as a representative of the equivalence class with respect to the binary relation $\stackrel{\pi}{=}$. The choice of a representative is immaterial since decoding is identity-blind (when all transmitters use the same encoder).

When there is more than one ordered $w_{[k]}$ that satisfies the threshold condition, decoder $g_k$ chooses among them uniformly at random. All such events are counted as errors in the error probability bound below.

A RAC Code that Decodes Transmitter Identity

While the use of the same encoder at all transmitters has a number of advantages for practical implementations, communication systems in accordance with many embodiments of the invention are not limited to that case, nor are they limited to channels that are permutation-invariant. In several embodiments, distinct encoders are utilized at some or all transmitters of a RAC. Under permutation-invariance (2) and identical encoding, the decoder typically cannot distinguish which transmitter sent each of the decoded messages without the message data itself containing bits (e.g. a header) that identifies the transmitter. Maintaining permutation-invariance, but replacing prior identical encoders with a different instance of the same random codebook for each of the encoders, a code can be obtained that achieves the same first- and second-order terms as in Theorem 1 with a decoder that can also associate the corresponding transmitter identity to each decoded message. The following definition formalizes the resulting RAC codes.

Definition 1'. An $(M, \{(n_k, \epsilon_k)\}_{k=0}^K)$ code with non-identical encoding is a collection of random encoding functions $$f_i : \mathcal{U} \times [M] \to X^{n_K}, i = 1, \ldots, K \quad (47)$$

and a collection of random decoding functions:

$$g_k : \mathcal{U} \times y_k^{n_k} \to \left\{ [M]^k \times \binom{[K]}{k} \right\} \cup e, k = 0, 1, \ldots, K. \quad (48)$$

At the start of each epoch, a random variable U on $\stackrel{\triangle}{=}$ with probability distribution $P_U$ is generated independently of the transmitter activity and revealed to the transmitters and the receiver to initialize the encoders and the decoder. If k transmitters in $\mathcal{A}$ are active, then, with probability at least $1 - \epsilon_k$, k messages and their corresponding transmitters' identities are correctly decoded at time $n_k$, and if k=0 transmitters are active, the unique message in set $[M]^0 = \{0\}$ is decoded at time $n_0$, with probability at least $1 - \epsilon_0$. That is $$\frac{1}{M^k} \sum_{\mathcal{L} \in [M]^k} \mathbb{P}[g_k(U, Y_k^{n_k}) \neq (\mathcal{L}, \mathcal{A}) \mid W_{[k]} = \mathcal{L}, |\mathcal{L}| = k] \leq \epsilon_k, \quad (49)$$

where $W_{[k]}$ are the independent and equiprobable messages of transmitters [k], and the given probability is calculated using the conditional distribution $$P_{Y_k^{n_k} | X_{\mathcal{A}}^{n_k}} = P_{Y_k^{n_k} | X_{\mathcal{A}}}^{n_k}$$

where $X_s^{n_k} = f_s(U, W_s)_{[n_k]}, s \in \mathcal{A}$.

In the discussion that follows, permutation-invariance (2) and employment of the input distribution $P_X$ at all encoders are assumed. As can readily be appreciated, these assumptions are not necessarily requirements of systems and methods in accordance with various embodiments of the invention, but are instead assumptions that can simplify analysis of a particular class of systems. Under these assumptions, the channel output statistics depend on the dimension of the channel input but not the identity of the active transmitters. For simplicity, it is assumed in the analysis that the set of active transmitters as $\mathcal{A} = [k]$, when $|\mathcal{A}| = k$.

The following theorem modifies Theorem 2 so that the transmitters' identities are also decoded by the decoder.

Theorem 2'. For any RAC $\{(X^k, P_{Y_k | X_{[k]}}(y_k | x_{[k]}), \mathcal{Y}_k)\}_{k=1}^K$ satisfying (2), (3), any $K < \infty$, and a fixed input distribution $P_X$, there exists an $(M, \{(n_k, \epsilon_k)\}_{k=0}^K)$ RAC code given in Definition 1' with $$\epsilon_0 \leq \mathbb{P}[h(Y_0^{n_0}) > \gamma_0] \quad (50)$$

$$\epsilon_k \leq \mathbb{P}[i_k(X_{[k]}^{n_k}; Y_k^{n_k}) \leq \log \gamma_k] + \mathbb{P}[h(Y_k^{n_0}) \leq \gamma_0] +$$

$$\sum_{t=1}^{k-1} \binom{k}{t} \mathbb{P}[i_t(X_{[t]}^{n_t}; Y_k^{n_k}) > \log \gamma_t] + \sum_{t=1}^{k} \sum_{s=1}^{t-1} \binom{k}{t-s}$$

-continued $$(\mathbb{P}[i_t(X_{[s+1:t]}^{n_t}; Y_k^{n_t}) > n_t \mathbb{E}[i_t(X_{[s+1:t]}; Y_k)] + \lambda_{s,t}^k]) +$$

$$\sum_{t=1}^{k} \sum_{s=1}^{t} \binom{k}{t-s}\binom{K-(t-s)}{s} M^s \quad 5$$

$$(\mathbb{P}[i_t(\overline{X}_{[s]}^{n_t}; Y_k^{n_t} \mid X_{[s+1:t]}) > \log \gamma_t - n_t \mathbb{E}[i_t(X_{[s+1:t]} Y_k)] - \lambda_{s,t}^k]).$$

for all k, where the $\lambda_{s,t}^k$ and $\gamma_t$ values are constants, and for any n, $(X_{[k]}^n, \overline{X}_{[k]}^n, Y_k^n)$ represents a random sequence drawn i.i.d. according to $P_{X_{[k]} \overline{X}_{[k]} Y_k}(x_{[k]}, \overline{x}_{[k]}, y_k) = (\Pi_{i=1}^{k} P_X(x_i) P_X(\overline{x}_i)) P_{Y_k|X_{[k]}}(y_k|x_{[k]})$.

Exemplary Encoder Design: The common randomness random variable U is modified as follows:

$$\mathcal{U} = \underset{i=1}{\overset{K}{\times}} \underset{j=1}{\overset{M}{\times}} \mathcal{U}_{ij} \quad (51)$$

$$P_U = \underset{i=1}{\overset{K}{\times}} \underset{j=1}{\overset{M}{\times}} P_{U_{ij}}, \quad (52)$$

where $\mathcal{U}_{ij} = X^{nK}$ and $P_{U_{ij}} = P_X^{nK}$ for i=1, ..., K, j=1, ..., M for a fixed $P_X$, and realization of $U = (U_{ij}: 1 \le i \le K, 1 \le j \le M)$, distributed according to $P_U$, determines the encoders and the decoder. For any to $w \in [M]$, we use $f_i(U,w)$ to denote the encoded description of w for transmitter $i \in [K]$. The codewords depend on U as $$f_i(U,w) = f_i(w) = U_{iw} \quad (53)$$

for every encoder $i \in [K]$. Let $f_{\mathcal{A}}(w_{\mathcal{A}}) \triangleq \{f_a(w_a) : a \in \mathcal{A}\}$ denote the encoded description of message vector $w_{\mathcal{A}}$ at the subset of encoders $\mathcal{A} \subset [K]$.

Exemplary Decoder Design: For k=0, the decoder uses the same rule $g_0(\cdot)$ as Theorem 2 given in (45). For each k≥1, after observing the output $y^{n_k}$, decoder $g_k$ employs a single threshold rule $$g_k(y^{n_k}) = \begin{cases} (w_{\mathcal{A}}, \mathcal{A}) & \text{if } i_k(f_{\mathcal{A}}(w_{\mathcal{A}})_{[n_k]}; y^{n_k}) > \log \gamma_k \\ & \text{for some } \mathcal{A} \subset [K], |\mathcal{A}| = k \\ e & \text{otherwise} \end{cases} \quad (54)$$

for some constant $\gamma_k$. Recall that the pair $(w_{\mathcal{A}}, \mathcal{A})$ refers to the set of transmitters $\mathcal{A}$ with individual messages $w_{\mathcal{A}}$.

To perform the task of decoding transmitter identity at the decoder, the condition of message ordering $(w_i < w_j \forall i < j)$ in the decoding rule (46) is removed. Therefore, at time $n_t$, the decoder can check the threshold rule for $$\binom{K}{t} M^t$$

(instead of $$\binom{M}{t})$$

message vectors. Once a message vector with size t passes the threshold rule, the identity of t active transmitters and their individual messages are decoded. Note that when K is finite, $$\binom{K}{t}$$

is a finite constant by assumption; therefore, the increased size of the message set does not affect the second-order term in our achievability result.

Tests for No Active Transmitters

Various processes including the Kolmogorov-Smirnov, Hoeffding, and Zeitouni-Gutman tests for determining an absence of active transmitters are described in U.S. Provisional Application Ser. No. 62/797,089, the disclosure of which is incorporated by reference above. In this section, an analysis is performed of the error probabilities of the composite binary hypothesis test used to decide between $H_0$: no active transmitters, and $H_1$: 1,2, ..., K active transmitters, which can be expressed following the notation in U.S. Provisional Application Ser. No. 62/797,089 as:

$$H_0: Y^{n_0} \sim P_{Y_0}^{n_0}$$

$$H_1: Y^{n_0} \sim P_{Y_i}^{n_0} \text{ for some } 1 \le i \le K. \quad (55)$$

In the context of Theorem 2, the maximal number of transmitters can be unbounded. In that case, enumerating all alternative possibilities as in (55) becomes infeasible. Therefore, a universal (goodness-of-fit) test can be employed:

$$H_0: Y^n \sim P_{Y_0}^n.$$

$$H_1: Y^n \not\sim P_{Y_0}^n. \quad (56)$$

The Lévy metric $d_L$ between distributions P and Q defined on the same measurable space can be given by $$d_L(P,Q) = \inf\{\epsilon > 0 : P[X \le x-\epsilon] - \epsilon \le Q[X \le x] \le P[X \le x+\epsilon] + \epsilon,$$
$$\forall x \in \mathbb{R}\}. \quad (57)$$

The Lévy ball centered at P with radius $\delta$ can be defined as $$B_L(P, \delta) = \{Q : d_L(P,Q) \le \delta\}. \quad (58)$$

The epirical distribution of an observed sequence $y_1, \ldots, y_n$ can be defined by $$\hat{P}_{y^n}(a) = \frac{1}{n} \sum_{i=1}^{n} 1\{y_i = a\}, a \in \mathcal{Y}. \quad (59)$$

A test statistic $h : \mathcal{Y}^n \mapsto \mathbb{R}$ is a function that takes the observed sequence $y^n$ as its input. A decision rule $\Omega = (\Omega_0, \Omega_1)$ for the binary hypothesis test is a sequence of partitions of $\mathcal{Y}^n$, i.e. $\mathcal{Y}^n = \Omega_0(n) \cup \Omega_1(n)$, n=1,2, ... and $\Omega_0(n) \cap \Omega_1(n) = \emptyset$. The decision rule $\Omega$ corresponding to $h(\cdot)$ is given by $$\Omega_0(n) = \{y^n \in \mathcal{Y}^n : h(y^n) \le \gamma_0\}$$

$$\Omega_1(n) = \mathcal{Y}^n \setminus \Omega_0(n), \quad (60)$$

where $\gamma_0$ is a constant determined by the desired error criterion.

Type-I and type-II errors of the decision rule $\Omega$ are defined as $$\alpha(\Omega(n)) \triangleq P_{Y_0}[Y^n \in \Omega_1(n)] \quad (61)$$

$$\beta(\Omega(n)) \triangleq Q[Y^n \in \Omega_0(n)], \quad (62)$$

where Q is the unknown alternative distribution of Y, which is one of $P_{Y_1}, \ldots, P_{Y_K}$.

Determining Initial Decoding Time $n_0$ for Use in Composite Hypothesis Tests It can be shown that there exists a positive constant C such that $n_0 \geq C \log n_1 + o(\log n_1)$ suffices to meet the error requirements for an effective composite hypothesis test. Theorem 2 allows a decoder in accordance with an embodiment of the invention to decode any message set of $k \leq K$ active transmitters without knowing the total number of transmitters K. The question can be asked "For a finite K, what is the smallest constant C>0 and the smallest second-order term $o(\log n_1)$ that can be achieved if the composite hypothesis test is allowed to depend on the alternative distributions $P_{Y_1}, \ldots, P_{Y_K}$?"

In a number of embodiments the duration of $n_0$ is determined using the following test statistic $h^{LRTT}: \mathcal{Y}^n \mapsto \mathbb{R}^K$, known as the log-likelihood ratio threshold test (LRTT), which is given by $$h^{LRTT}(y^n) = -\begin{bmatrix} \sum_{i=1}^{n} \log \frac{P_{Y_0}(y_i)}{P_{Y_1}(y_i)} \\ \sum_{i=1}^{n} \log \frac{P_{Y_0}(y_i)}{P_{Y_2}(y_i)} \\ \vdots \\ \sum_{i=1}^{n} \log \frac{P_{Y_0}(y_i)}{P_{Y_K}(y_i)} \end{bmatrix}. \quad (63)$$

The corresponding decision rule $\Omega^{LRTT}$ with a threshold vector $\tau \in \mathbb{R}^K$ is defined as $$\Omega_0^{LRTT}(n) = \{y^n \in \mathcal{Y}^n : h^{LRTT}(y^n) \geq -\tau\}$$

$$\Omega_1^{LRTT}(n) = \mathcal{Y}^n \setminus \Omega_0^{LRTT}(n), \quad (64)$$

where the inequality between vectors is element-wise.

The set of achievable type-II error vectors for any composite hypothesis test in the form of (55) with a type-I error not exceeding $\epsilon_0 \in (0,1)$ can be defined as $$\varepsilon_{\epsilon_0}(P_{Y_0}, \{P_{Y_j}\}_{j=1}^K) \triangleq \{[e_1, \ldots, e_K]^T : \exists \text{ a decision rule}$$

$\Omega(n)$ such that $$\mathbb{P}[Y_0^n \in \Omega_1(n)] \leq \epsilon_0,$$

$$\mathbb{P}[Y_j^n \in \Omega_0(n)] = e_j, 1 \leq j \leq k\}, \quad (65)$$

where $Y_0^n \sim P_{Y_0}^n$ and $Y_j^n \sim P_{Y_j}^n$. Denote by $e_{\epsilon_0}(P_{Y_0}, \{P_{Y_j}\}_{j=1}^K)$ the minimax type-II error among the alternative distributions $P_{Y_1}, \ldots, P_{Y_K}$ given by $$e_{\epsilon_0}(P_{Y_0}, \{P_{Y_j}\}_{j=1}^K) \triangleq \min_{b \in \varepsilon_{\epsilon_0}(P_{Y_0}, \{P_{Y_j}\}_{j=1}^K)} \max_{j \in [K]} b_j. \quad (66)$$

The log-likelihood random vector can also be defined $$L \triangleq \begin{bmatrix} \log \frac{P_{Y_0}(Y)}{P_{Y_1}(Y)} \\ \log \frac{P_{Y_0}(Y)}{P_{Y_2}(Y)} \\ \vdots \\ \log \frac{P_{Y_0}(Y)}{P_{Y_K}(Y)} \end{bmatrix}, 1 \leq i \leq n \quad (67)$$

and the sum $$S \triangleq \sum_{i=1}^{n} L_i, \quad (68)$$

where $Y \sim P$ for an arbitrary distribution $P$ on $\mathcal{Y}$, and $L_1, \ldots, L_n$ are i.i.d. copies of L. The mean vector and covariance matrix of L with respect to $P_{Y_0}$ are given by $$D \triangleq \mathbb{E}_{P_{Y_0}}[L] = [D(P_{Y_0} \| P_{Y_1}), \ldots, D(P_{Y_0} \| P_{Y_K})]^T \quad (69)$$

$$K \triangleq Cov_{P_{Y_0}}[L]. \quad (70)$$

Denote for brevity $$D_j = D(P_{Y_0} \| P_{Y_j}) \quad (71)$$

$$D_{min} = \min_{i \in [K]} D_i$$

$$\mathcal{I}_{min} = \{j \in [K] : D_j = D_{min}\}$$

$$L_{min} = \left[\log \frac{P_{Y_0}(Y)}{P_{Y_j}(Y)} : j \in \mathcal{I}_{min}\right]^T.$$

The following theorem gives the asymptotics of the error region defined in Definition (65).

Theorem 3. Assume that $P_{Y_0} \ll P_{Y_j}$ for $j=1, \ldots, K, 0 < D_j \infty$ for $j=1, \ldots, K$, K is positive definite, and $$T = \mathbb{E}_{P_{Y_0}}[\|L - D\|_2^3] < \infty.$$

Then for any $\epsilon_0 \in (0,1)$, it holds that $$\varepsilon_{\epsilon_0}\left(P_{Y_0}, \{P_{Y_j}\}_{j=1}^K\right) \quad (72)$$

$$\supset \exp\left\{-nD + \sqrt{n}\mathcal{Q}_{inv}(K, \epsilon_0) - \frac{1}{2}\log n1 + O(1)1\right\},$$

and $$\varepsilon_{\epsilon_0}\left(P_{Y_0}, \{P_{Y_j}\}_{j=1}^K\right) \quad (73)$$

$$\subset \exp\{-nD + \sqrt{n}\mathcal{Q}_{inv}(K, \epsilon_0) + o(\sqrt{n})1\}.$$

Moreover, $$e_{\epsilon_0}\left(P_{Y_0}, \{P_{Y_j}\}_{j=1}^K\right) = \exp\{-nD_{min} + \sqrt{n} b + o(\sqrt{n})\}, \quad (74)$$

where b is the solution of $$\mathbb{P}_{[Z \leq b1]} = 1 - \epsilon_0, \quad (75)$$

$$Z \sim \mathcal{N}(0, \mathrm{Cov}_{P_{Y_0}}[L_{min}]).$$

In many embodiments, the best second-order term can be achieved by the LRTT and for these tests, the maximum achievable type-II error is bounded by $$\max_{k \in [K]} \beta_k(\Omega^{LRTT})$$

$$\leq \exp\left\{-n \min_{k \in [K]} D(P_{Y_0} \| P_{Y_k}) + b\sqrt{n} + o(\sqrt{n})\right\}, \quad (76)$$

where b is the solution of $$\mathbb{P}_{[Z \leq b1]} = 1 - \epsilon_0, \quad (77)$$

and $$Z \sim \mathcal{N}(0, \mathrm{Cov}_{P_{Y_0}}[L_{min}]).$$

Rewriting (76), it can be seen that $$n_0 \geq \frac{1}{2 \min_{k \in [K]} D(P_{Y_0} \| P_{Y_k})} \log n_1 \quad (78)$$

$$+ \frac{b}{\sqrt{2(\min_{k \in [K]} D(P_{Y_0} \| P_{Y_k}))^3}} \sqrt{\log n_1} + o(\sqrt{\log n_1}).$$

Theorem 3 implies that the coefficients of $\log n_1$ and $\sqrt{\log n_1}$ in (78) are indeed optimal.

While specific decision rules are described above, it can be readily appreciated that any of a variety of techniques can be utilized to determine that no transmitters are transmitting including (but not limited to) measuring the noise floor and/or other characteristics of a RAC channel. Furthermore, decoders in accordance with various embodiments of the invention can utilize an initial period $n_0$ determined using any of a variety techniques appropriate to the requirements of a given communication system to determine whether any transmitters are active in accordance with various embodiments of the invention.

Although the present, invention has been described in certain specific aspects, many additional modifications and variations would be apparent to those skilled in the art. It is therefore to be understood that the present invention can be practiced otherwise than specifically described including any of a variety of rateless codes, sets of decoding durations, and/or point-to-point or broadcast feedback communication channels between the transmitter and receiver including (but not limited to) the receiver transmitting feedback on the same channel being used to transmit without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

What is claimed is:

1. A communication system, comprising:
a plurality of transmitters that each comprise an encoder, wherein the encoder of a given transmitter is configured to:
receive a start of epoch message;
select a codebook;
encode message data as symbols using a rateless code determined using the selected codebook; and
receive feedback messages at a predetermined set of potential decoding times;
wherein the transmitter is configured to transmit symbols until a received feedback message is an end of epoch message; and
a receiver configured to simultaneously receive messages from the plurality of transmitters, where the receiver comprises a decoder configured to:
select at least one codebook;
cause a broadcast transmitter to transmit at least one start of epoch message;
receive observed symbols;
at each of a predetermined set of decode times, determine whether a decoding rule is satisfied; and
when the decoding rule is satisfied:
decode a plurality of messages received simultaneously from at least two of the plurality of transmitters based upon the received observed symbols and based upon the rateless code and the selected at least one codebook; and
cause the broadcast transmitter to transmit an end of epoch message.

2. The communication system of claim 1, wherein the determination of whether a decoding rule is satisfied is based upon the received observed symbols.

3. The communication system of claim 1, wherein the transmitter is configured to select a codebook based upon the start of epoch message.

4. The communication system of claim 1, wherein the broadcast transmitter transmits the at least one start of epoch message based upon the selected at least one codebook.

5. The communication system of claim 1, wherein the broadcast transmitter is further configured to transmit at least one additional message based upon the selected at least one codebook.

6. The communication system of claim 1, wherein multiple transmitters in the plurality of transmitters include encoders that are configured to select the same codebook to use in the encoding of message data as symbols using a rateless code.

7. The communication system of claim 1, wherein at least two of the plurality of transmitters include encoders that are configured to select different codebooks to use in the encoding of message data as symbols using a rateless code.

8. The communication system of claim 7, wherein the receiver applies decoding rules at separate predetermined times with respect to each of the different codebooks.

9. The communication system of claim 1, wherein the broadcast transmitter sends a negative acknowledgement feedback message when the decoding rule is not satisfied at a predetermined decode time.

10. The communication system of claim 1, wherein the encoder is configured to continue to encode message data as symbols using a rateless code determined using the selected codebook in response to receipt of a negative acknowledgement feedback message.

11. A receiver system, comprising:
a decoder configured to select at least one codebook;
a transmitter configured to transmit at least one start of epoch message;
a receiver configured to receive observed symbols;
wherein the decoder is further configured to:
   determine whether a decoding rule is satisfied at each of a predetermined set of decode times; and
   when the decoding rule is satisfied:
      decode a plurality of messages received simultaneously from a plurality of transmitters based upon the received observed symbols and based upon a rateless code and the selected at least one codebook; and
   cause the transmitter to transmit an end of epoch message.

12. The receiver system of claim 11, wherein the determination of whether a decoding rule is satisfied is based upon the received observed symbols.

13. The receiver system of claim 11, wherein the transmitter transmits the at least one start of epoch message based upon the selected at least one codebook.

14. The receiver system of claim 11, wherein the transmitter is further configured to transmit at least one additional message based upon the selected at least one codebook.

15. The receiver system of claim 11, wherein the decoder is configured to select a single codebook.

16. The receiver system of claim 11, wherein the decoder is configured to select a plurality of different codebooks and applies decoding rules at separate predetermined times with respect to each of the different codebooks.

17. The receiver system of claim 11, wherein the transmitter sends a negative acknowledgement feedback message when the decoding rule is not satisfied at a predetermined decode time.

* * * * *